(12) United States Patent
Yamaguchi et al.

(10) Patent No.: US 11,553,606 B2
(45) Date of Patent: Jan. 10, 2023

(54) DISPLAY DEVICE

(71) Applicant: Japan Display Inc., Tokyo (JP)

(72) Inventors: Hajime Yamaguchi, Tokyo (JP); Yasushi Tomioka, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/585,559

(22) Filed: Jan. 27, 2022

(65) Prior Publication Data

US 2022/0151086 A1 May 12, 2022

Related U.S. Application Data

(63) Continuation of application No. 16/897,301, filed on Jun. 10, 2020, now Pat. No. 11,277,926, which is a continuation of application No. PCT/JP2018/045180, filed on Dec. 7, 2018.

(30) Foreign Application Priority Data

Dec. 11, 2017 (JP) .............................. JP2017-237067

(51) Int. Cl.
*H05K 7/02* (2006.01)
*H05K 7/04* (2006.01)
*H05K 5/00* (2006.01)
*H01L 27/32* (2006.01)
*H01L 51/52* (2006.01)
*H05K 1/14* (2006.01)
*H05K 5/03* (2006.01)

(52) U.S. Cl.
CPC ....... *H05K 5/0017* (2013.01); *H01L 27/3244* (2013.01); *H01L 51/5237* (2013.01); *H05K 1/147* (2013.01); *H05K 5/03* (2013.01); *H05K 2201/10128* (2013.01)

(58) Field of Classification Search
USPC ................................................. 361/760, 809
See application file for complete search history.

(56) References Cited

U.S. PATENT DOCUMENTS

2019/0280075 A1* 9/2019 Chung .................. H05K 1/189

* cited by examiner

*Primary Examiner* — Hung S. Bui
(74) *Attorney, Agent, or Firm* — Xsensus LLP

(57) ABSTRACT

According to one embodiment, a display device includes a first submodule having a display panel, a second submodule having a cover member located on the display panel, and a first decoupling layer located between the first submodule and the second submodule, and each of the first submodule and the second submodule has a single neutral plane.

9 Claims, 22 Drawing Sheets

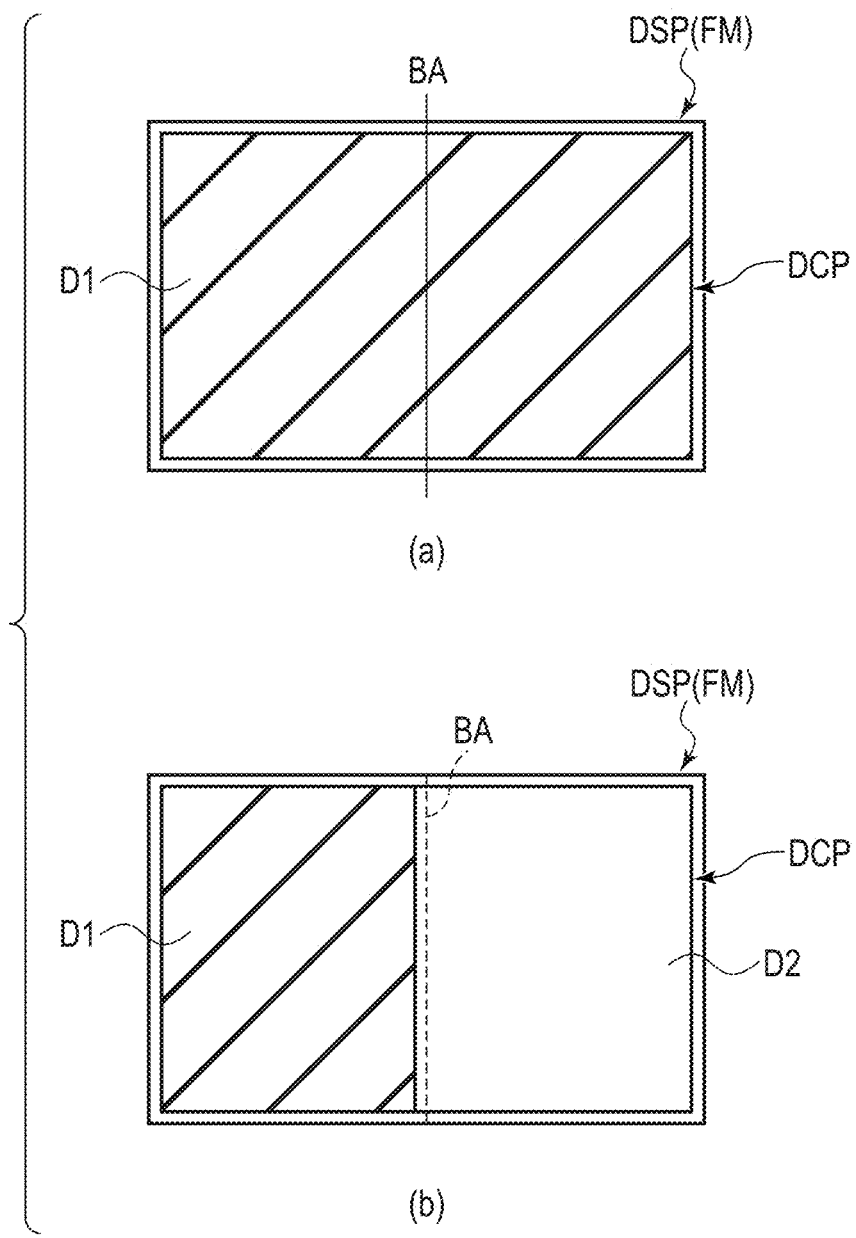
F I G. 10

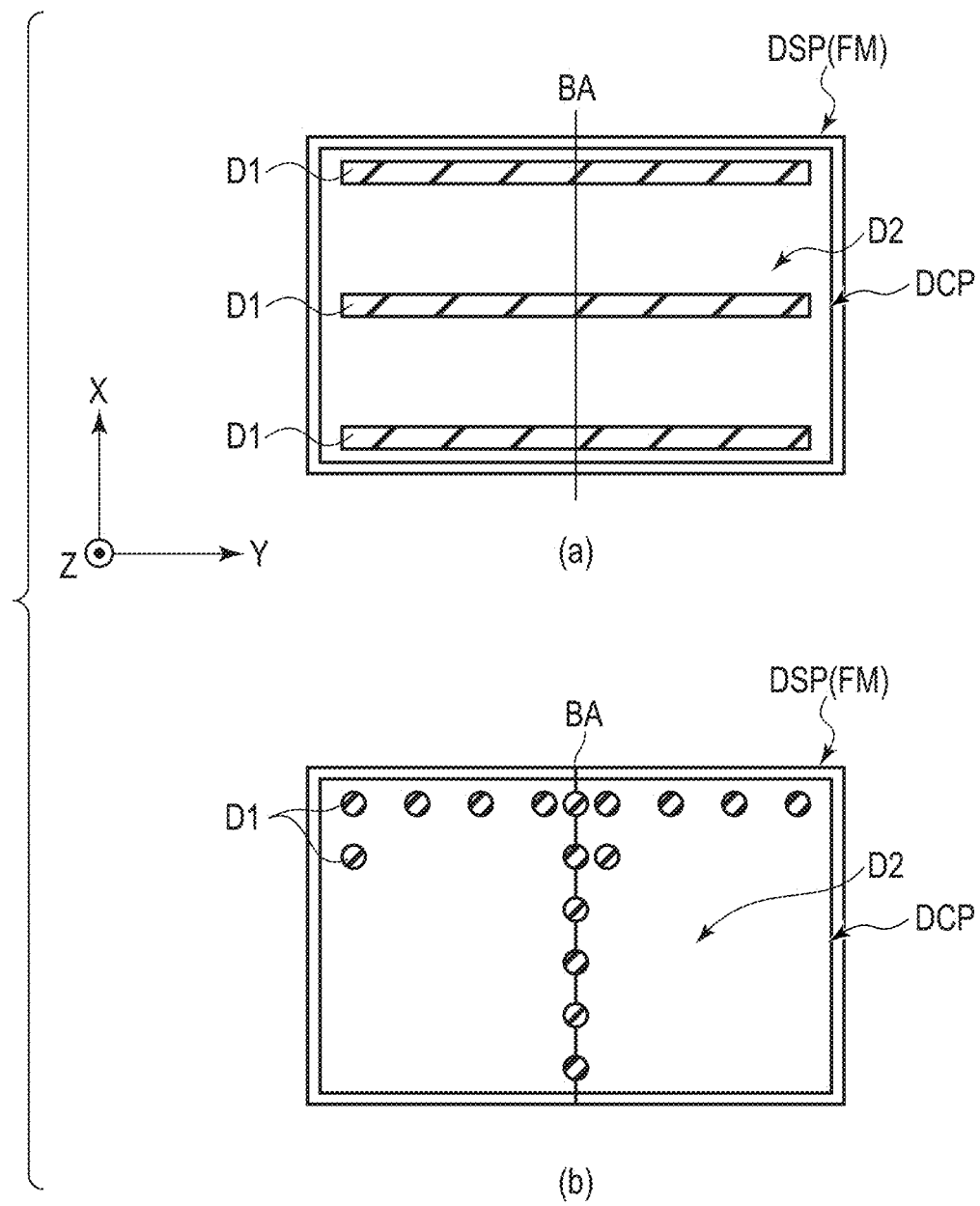
F I G. 11

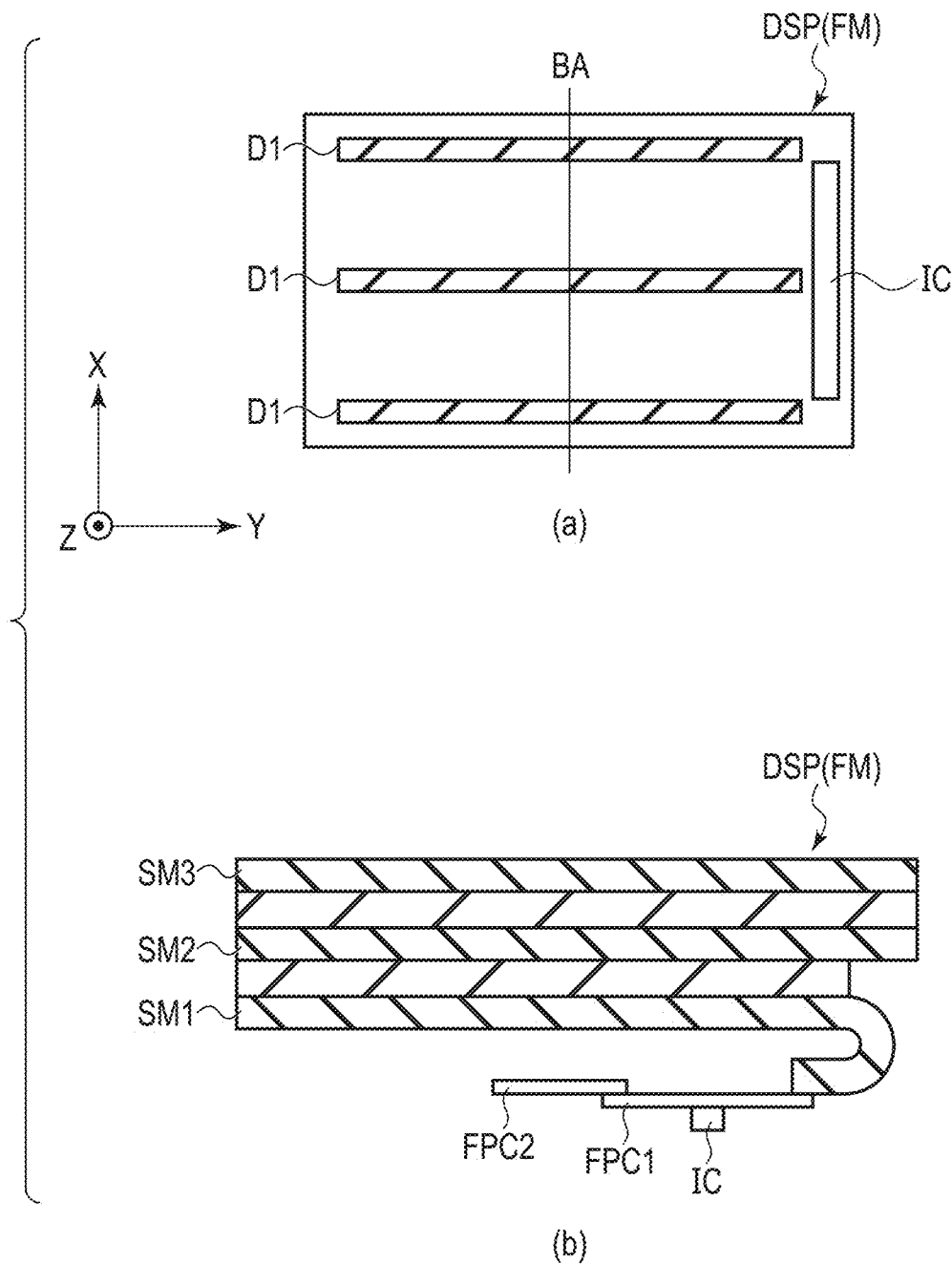
F I G. 12

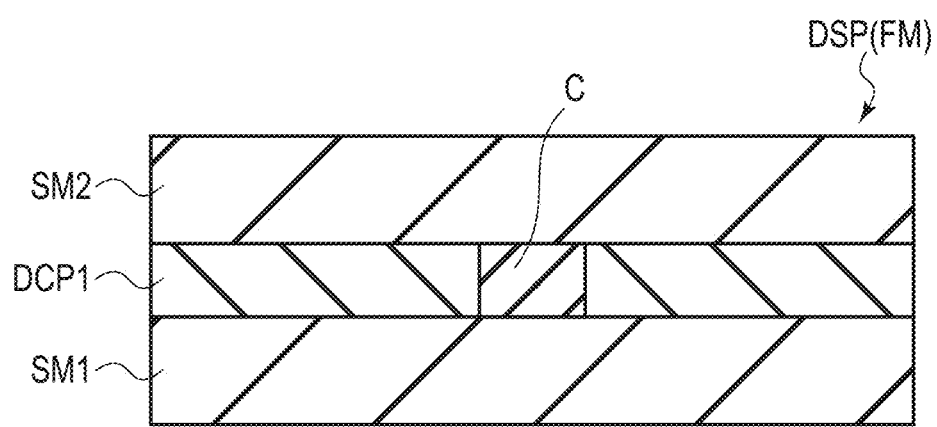
F I G. 13

(1) [figure]

(2) $$PC = 8 \times \underbrace{\frac{4Ebh^3}{L^3}}_{p} \delta \quad \text{-------- Equation 2}$$

(3) [figure]

(4) $$PD = 2 \times \underbrace{\frac{4Ebh^3}{L^3}}_{p} \delta \quad \text{-------- Equation 3}$$

(5) [figure]

(6) $$C.C = \frac{P - PD}{PC - PD} \quad \text{-------- Equation 4}$$

F I G. 23

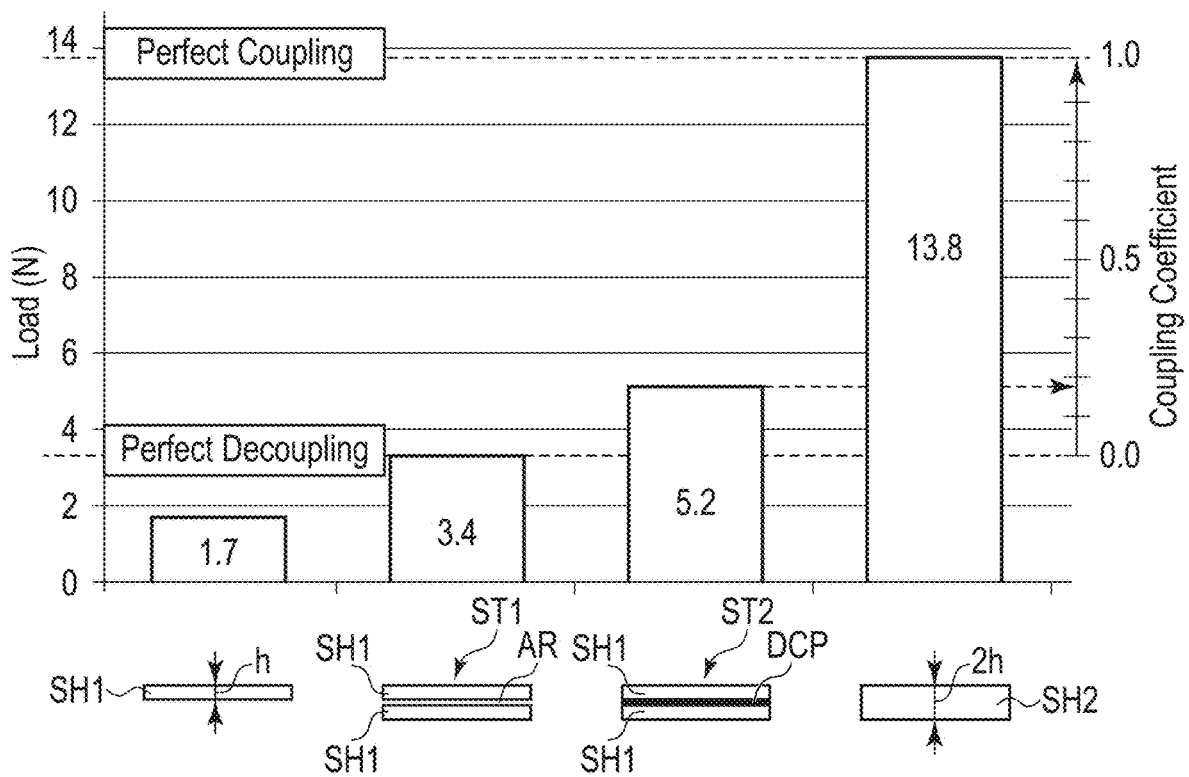
F I G. 24
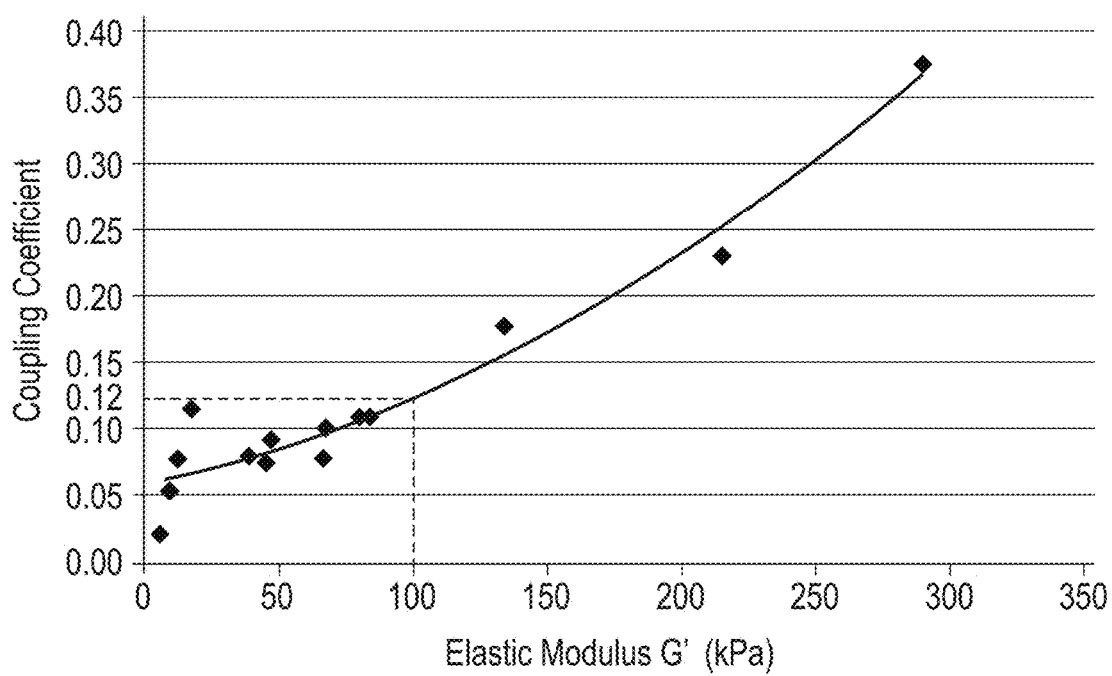
F I G. 25

DISPLAY DEVICE

CROSS-REFERENCE TO RELATED APPLICATIONS

This application is a continuation of U.S. application Ser. No. 16/897,301, filed Jun. 10, 2020, which is a Continuation Application of PCT Application No. PCT/JP2018/045180, filed Dec. 7, 2018 and based upon and claiming the benefit of priority from Japanese Patent Application No. 2017-237067, filed Dec. 11, 2017, the entire contents of all of which are incorporated herein by reference.

FIELD

Embodiments described herein relate generally to a display device.

BACKGROUND

Recently, flexible modules such as a display, a light and the like which can be folded and unfolded have been developed. The flexible module is formed by, for example, disposing a light-emitting element, an electrode or the like on a flexible plastic film or the like. To prevent breaking of a member and peeling between members caused by a bend stress when the flexible module is bent, a technology of forming a stress buffer layer between members is known. On the other hand, if a resilience does not act in the stress buffer layer, the relative positional relationship in a planar direction between the members does not return to its original state when returning from a bent state to a flat slate. In this case, for example, the coordinates of a display panel and the coordinates of a display are misaligned, and a position different from a position which the user intended may be detected. In addition to the combination of the touch panel and the display, the unintended misalignment between the members at the time of returning to a flat state also causes degradation in performance including product reliability.

The present embodiment aims to provide a display device which can suppress degradation in performance.

BRIEF DESCRIPTION OF THE DRAWINGS

FIG. 10 is a plan view showing the configuration of a decoupling layer.

FIG. 11 is a plan view showing the configuration of the decoupling layer.

FIG. 12 is an illustration showing the position of a driver.

FIG. 13 is a cross-sectional view showing another configuration of the flexible module.

FIG. 23 is an illustration showing the relationship between a deflection and a load according to two overlapping first sheet members SH1.

FIG. 24 is an illustration showing the measurement evaluation of the coupling coefficient of the decoupling layer.

FIG. 25 is an illustration showing the relationship between the coupling coefficient and the elastic modulus of the decoupling layer.

DETAILED DESCRIPTION

Figure 1:
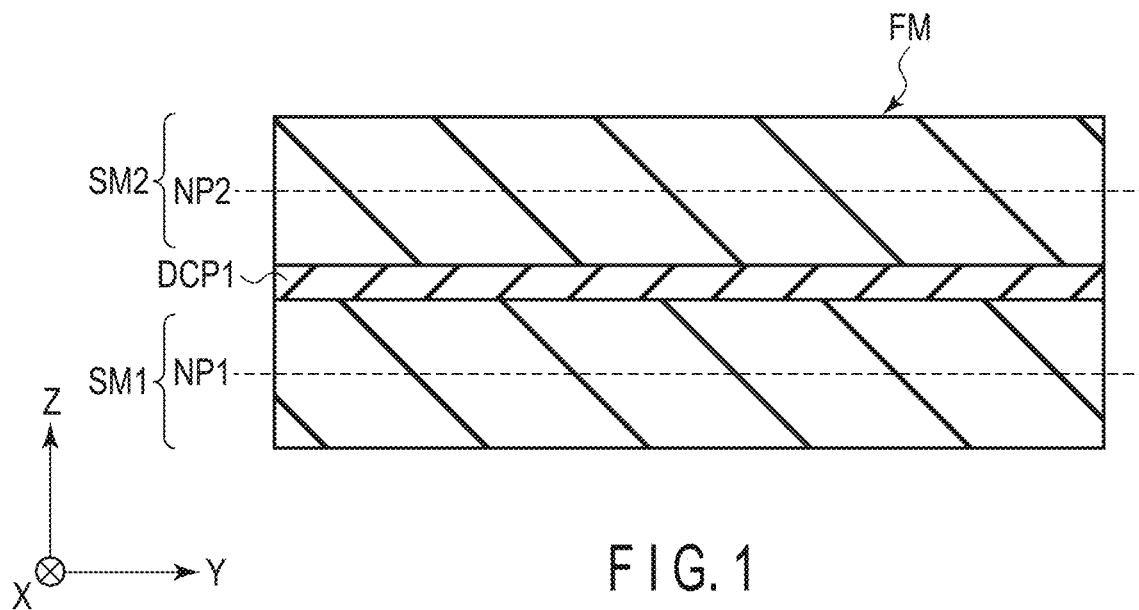
FIG. 1 is a cross-sectional view showing the configuration of a flexible module according to the present embodiment.

In general, according to one embodiment, there is provided a display device including a first submodule having a display panel, a second submodule having a cover member located on the display panel, and a first decoupling layer located between the first submodule and the second submodule, and each of the first submodule and the second submodule has a single neutral plane.

The present embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented, but such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed explanations of them that are considered redundant may be arbitrarily omitted.

First, the configuration of a flexible module FM of the present embodiment will be described.

Note that the flexible module FM presented in the present embodiment can be applied to a display device, a sensor device, a force feedback device, a combination of these devices or the like.

FIG. 1 is a cross-sectional view showing the configuration of the flexible module FM according to the present embodiment. A first direction X, a second direction Y and a third direction Z are orthogonal to one another in the illustrated example but may cross one another at an angle other than 90 degrees.

In the present embodiment, a direction toward the pointing end of an arrow of the third direction Z is defined as above, and a direction opposite to the direction toward the pointing end of the arrow of the third direction Z is defined as below. In addition, when described as "the second member above the first above" and "the second member below the first member", the second member may be in contact with the first member or may be separated from the first member. In the latter case, the third member may be interposed between the first member and the second member.

The flexible module FM includes a first submodule SM1, a second submodule SM2 and a first decoupling layer DCP1 located between the first submodule SM1 and the second submodule SM2.

In the present embodiment, the decoupling layer corresponds to a layer which decouples stresses produced in a plurality of submodules from each other by sliding the submodules over each other to prevent the stresses in the submodules from affecting each other when the flexible module FM is bent. That is, in FIG. 1, since the first decoupling layer DCP1 is disposed between the first submodule SM1 and the second submodule SM2, each of the first submodule SM1 and the second module SM2 has a single neutral plane. The first submodule SM1 has a single neutral plane NP1, and the second submodule SM2 has a single neutral plane NP2. Here, the neutral plane corresponds to a plane in which a tensile stress and a compressive stress generated when the flexible module FM is bent are zero.

Note that each of the first submodule SM1 and the second submodule SM2 may be formed of a plurality of members. When one submodule is formed of a plurality of members, the members are fastened together by a coupling layer which will be described later, and the members integrally deform. Therefore, one submodule has a single neutral plane.

In addition, as will be described later, when the flexible module FM is a display device, the display device includes a display panel and a cover member located on the display panel. For example, the first submodule SM1 includes the display panel, and the second submodule SM2 includes the cover member.

Figure 2:
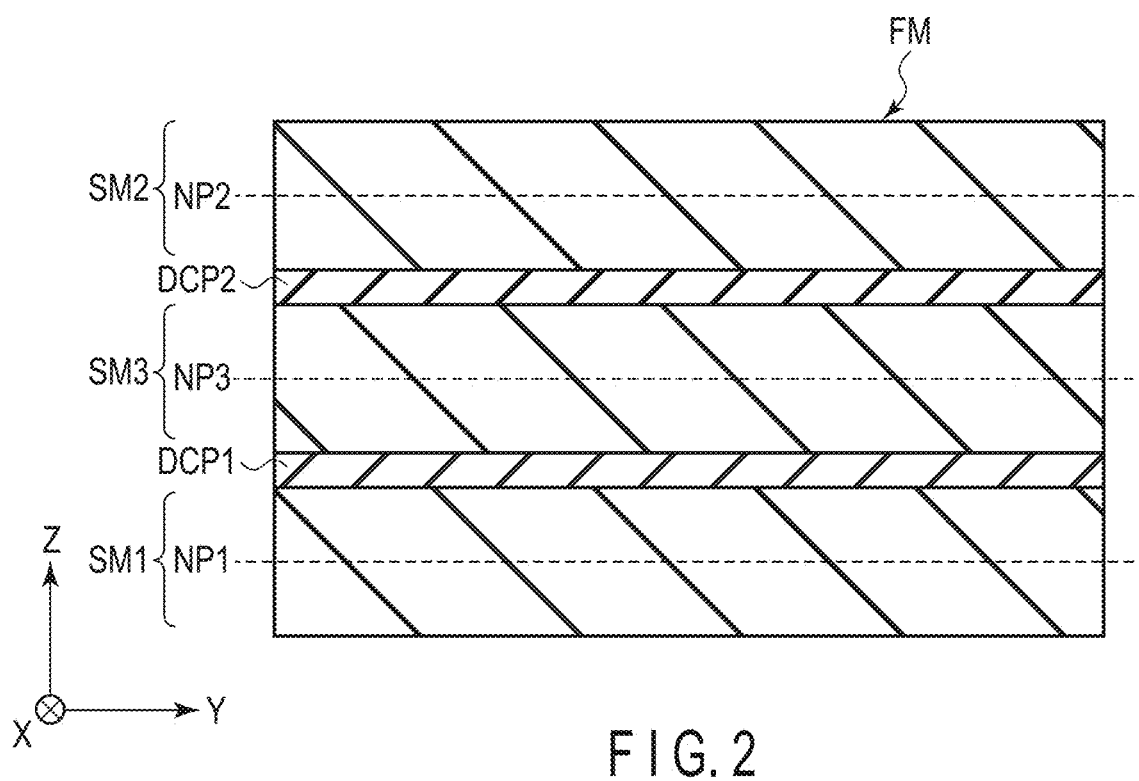
FIG. 2 is a cross-sectional view showing another configuration of the flexible module according to the present embodiment.

FIG. 2 is a cross-sectional view showing another configuration of the flexible module FM according to the present embodiment. The configuration shown in FIG. 2 differs from the configuration shown in FIG. 1 in that the flexible module FM includes a third submodule SM3 and a second decoupling layer DCP2.

The third submodule SM3 is located between the first submodule SM1 and the second submodule SM2. The first decoupling layer DCP1 is located between the first submodule SM1 and the third submodule SM3. The second decoupling layer DCP2 is located between the second submodule SM2 and the third submodule SM3. The third submodule SM3 has a single neutral plane NP3. Note that the third submodule SM3 may be formed of a plurality of members, and in that case, the members are fastened together by a coupling layer which will be described later.

In addition, as will be described later, when the flexible module FM is a display device, the display device includes a touch panel and a polarizer between a display panel and a cover member. For example, the third submodule SM3 includes at least one of the touch panel and the polarizer. When the third submodule SM3 includes the touch panel, the polarizer may be included in either the first submodule SM1 or the second submodule SM2. When the third submodule includes the polarizer, the touch panel may be included in either the first submodule SM1 or the second submodule SM2.

Figure 3:
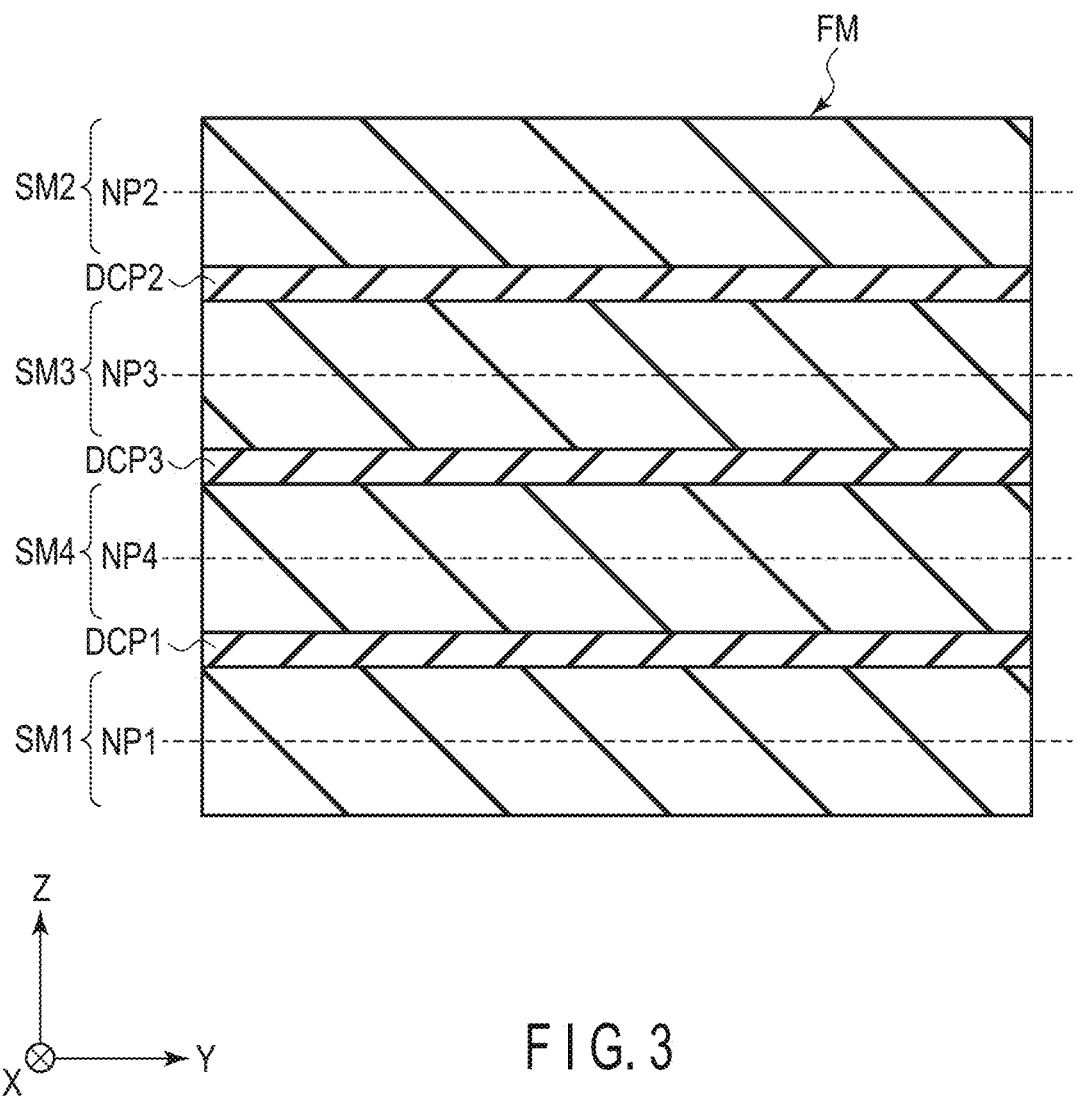
FIG. 3 is a cross-sectional view showing another configuration of the flexible module according to the present embodiment.

FIG. 3 is a cross-sectional view showing another configuration of the flexible module FM according to the present embodiment. The configuration shown in FIG. 3 differs from the configuration shown in FIG. 2 in that the flexible module FM includes a fourth submodule SM4 and a third decoupling layer DCP3.

The fourth submodule SM4 is located between the first submodule SM1 and the third submodule SM3. The first decoupling layer DCP1 is located between the first submodule SM1 and the fourth submodule SM4. The second decoupling layer DCP2 is located between the second submodule SM2 and the third submodule SM3. The third decoupling layer DCP3 is located between the third submodule SM3 and the fourth submodule SM4. The fourth submodule SM4 has a single neutral plane NP4. Note that the fourth submodule SM4 may be formed of a plurality of members, and in that case, the members are fastened together by a coupling layer which will be described later.

In addition, when the flexible module FM is a display device, for example, the third submodule SM3 includes a polarizer, and the fourth submodule SM4 includes a touch panel.

Figure 4:
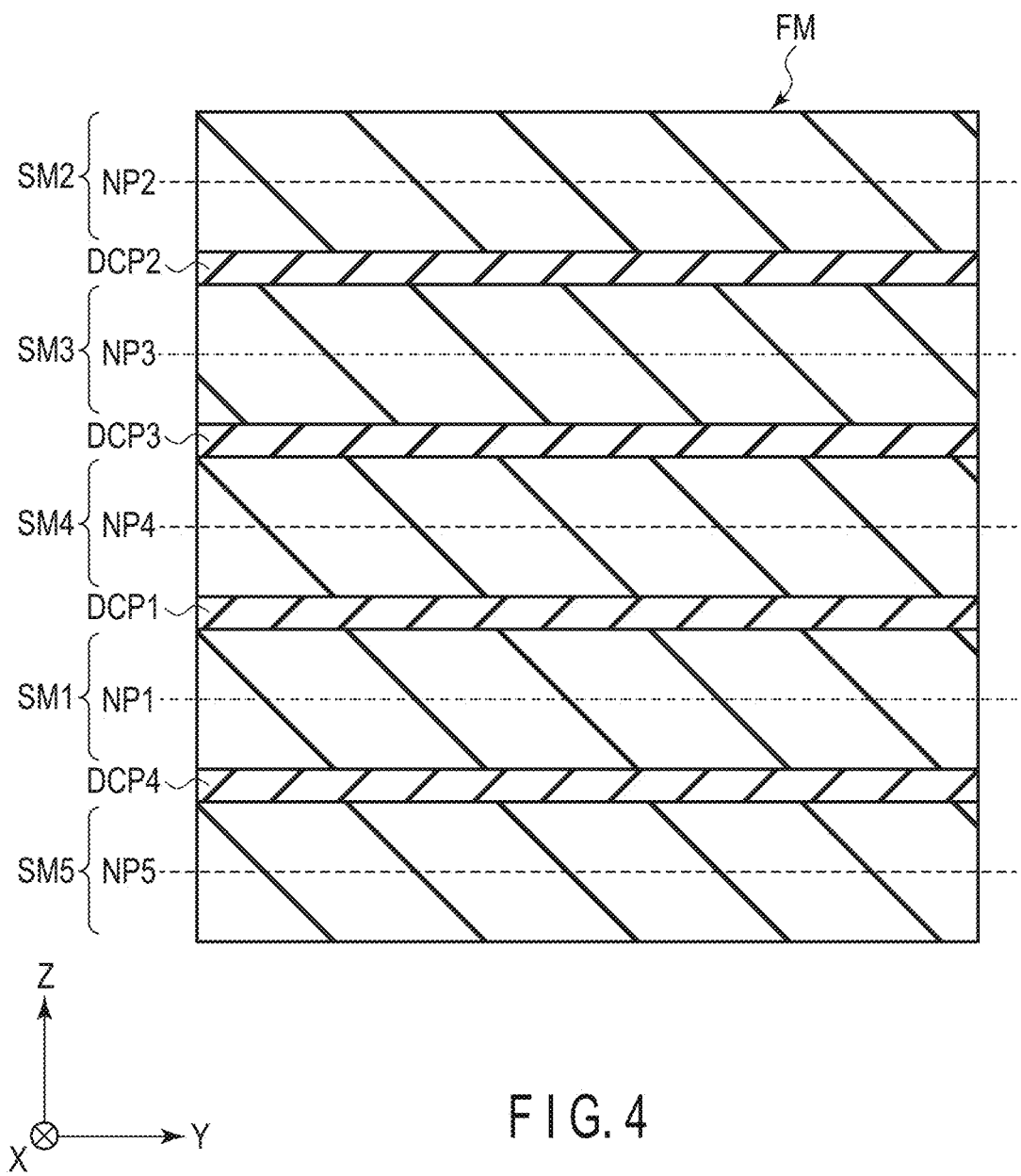
FIG. 4 is a cross-sectional view showing another configuration of the flexible module according to the present embodiment.

FIG. 4 is a cross-sectional view showing another configuration of the flexible module FM according to the present embodiment. The configuration shown in FIG. 4 differs from the configuration shown in FIG. 3 in that the flexible module FM includes a fifth submodule SM5 and a fourth decoupling layer DCP4.

The fifth submodule SM5 is located below the first submodule SM1. The fourth decoupling layer DCP4 is located between the first submodule SM1 and the fifth submodule SM5. The fifth submodule SM5 has a single neutral plane NP5. Note that the fifth submodule SM5 may be formed of a plurality of members, and in that case, the members are fastened together by a coupling layer which will be described later.

In addition, as will be described later, if the flexible module FM is a display device, the display device may include, for example, a heat dissipation layer, a force feedback sheet, an illumination device, a buffer sheet, a sensor sheet, a housing and the like. For example, the fifth submodule SM5 includes at least one of the heat dissipation layer, the force feedback sheet, the illumination device, the buffer sheet, the sensor sheet and the housing.

Next, a display device DSP will be disclosed as an example of the flexible module FM. This display device can be used for various devices such as a smartphone, a tablet computer, a mobile telephone, a notebook computer and a game console. The main configuration disclosed in the present embodiment can be applied to a liquid crystal display device, a self-luminous display device such as an organic electroluminescent display device, an electronic paper display device having an electrophoretic element, etc., a display device employing micro-electromechanical systems (MEMS), a display device employing electrochromism and the like.

Figure 5:
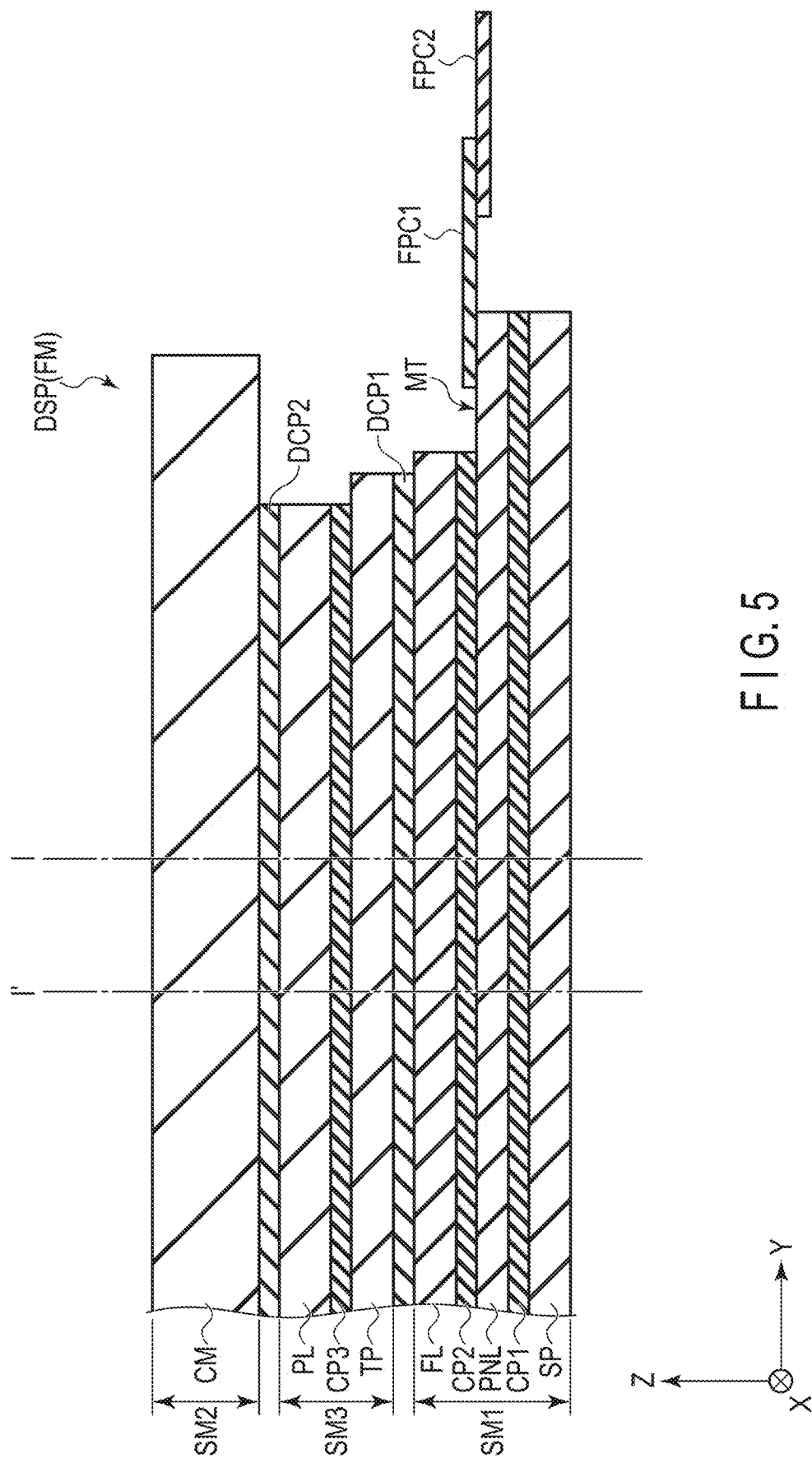
FIG. 5 is an illustration showing a practical example of the flexible module shown in FIG. 2.

FIG. 5 shows a practical example of the flexible module FM shown in FIG. 2. That is, the display device DSP is divided into the first submodule SM1, the second submodule SM2 and the third submodule SM3 by the first decoupling layer DCP1 and the second decoupling layer DCP2.

The display device DSP includes a support substrate SP, a display panel PNL, a wiring substrate FPC1, a wiring substrate FPC2, a film FL, a touch panel TP, a polarizer PL, a cover member CM, a first coupling layer CP1, a second coupling layer CP2, a third coupling layer CP3, the first decoupling layer DCP1, the second decoupling layer DCP2 and the like. In the present embodiment, the coupling layer corresponds to a layer which couples stresses in one submodule such that a plurality of members constituting one submodule integrally deform when the flexible module FM is bent.

In the illustrated example, the first submodule SM1 is formed of the support substrate SP, the first coupling layer CP1, the display panel PNL, the second coupling layer CP2 and the film FL. The support substrate SP is bonded below the display panel PNL by the first coupling layer CP1. The film FL is bonded above the display panel PNL by the second coupling layer CP2. That is, the first coupling layer CP1 is located between the support substrate SP and the display panel PNL. In addition, the second coupling layer CP2 is located between the display panel PNL and the film FL.

The display panel PNL has a mounting portion MT which extends more outward than an area overlapping the film FL. In the illustrated example, the wiring substrate FPC1 is mounted on the mounting portion MT. The display panel PNL and the wiring substrate FPC1 are electrically connected to each other. The wiring substrate FPC2 is disposed below the wiring substrate FPC1 and is electrically connected to the wiring substrate FPC1. The wiring substrate FPC2 overlaps a side opposite to a side overlapping the display panel PNL of the wiring substrate FPC1. Note that the wiring substrate FPC2 may be disposed on the wiring substrate FPC1. In addition, since the wiring substrates FPC1 and FPC2 are not disposed at a bend position of the display device DSP, the wiring substrates FPC1 and FPC2 are not involved in the stresses generated in the display device DSP or are not included in the submodules.

In the illustrated example, the third submodule SM3 is formed of the touch panel TP, the third coupling layer CP3 and the polarizer PL. The polarizer PL is located more upward than the touch panel TP. The polarizer PL and the touch panel TP are bonded together by the third coupling layer CP3. That is, the third coupling layer CP3 is located between the polarizer PL and the touch panel TP.

In the illustrated example, the second submodule SM2 is formed of the cover member CM. The cover member CM is, for example, a plastic film.

In the illustrated example, the first decoupling layer DPC1 is disposed between the film FL and the touch panel TP and bonds them together. In the illustrated example, the second decoupling layer DCP2 is disposed between the polarizer PL and the cover member CM and bonds them together. In addition, the first decoupling layer DCP1 and the second decoupling layer DCP2 are formed of a material containing a non-linear elastic solid or both a non-linear elastic solid and a viscous fluid as will be described later. The first decoupling layer DCP1 and the second decoupling layer DCP2 may be formed of the same material or may be formed of different materials. Furthermore, one decoupling layer may be formed of one material or may be formed of two or more different materials. In the example shown in FIG. 5, the first decoupling layer DCP1 and the second decoupling layer DCP2 are transparent. The decoupling layers located closer to a display surface side than light-emitting members contributing display such as an illumination device and a light-emitting element are formed of a transparent material. Here, the display surface side corresponds to the upper surface side of the cover member CM.

The coupling layers CP are formed of a material containing acrylic resin, silicon resin, polyurethane resin or the like. The coupling layers CP are formed by, for example, room-temperature curing, thermal curing or UV curing. When the coupling layers CP are formed by thermal curing, resin to be used is preferably resin which is cured at a temperature of less than or equal to 100° C. In the same manner as the decoupling layers DCP, the coupling layers CP located closer to the display surface side than the light-emitting members are formed of a transparent member. In addition, the coupling layers CP are formed by, for example, lamination such as atmospheric lamination or vacuum lamination. Furthermore, the thickness of the coupling layers CP is 10 μm to 250 μm, preferably, 25 μm to 100 μm.

Figure 6:
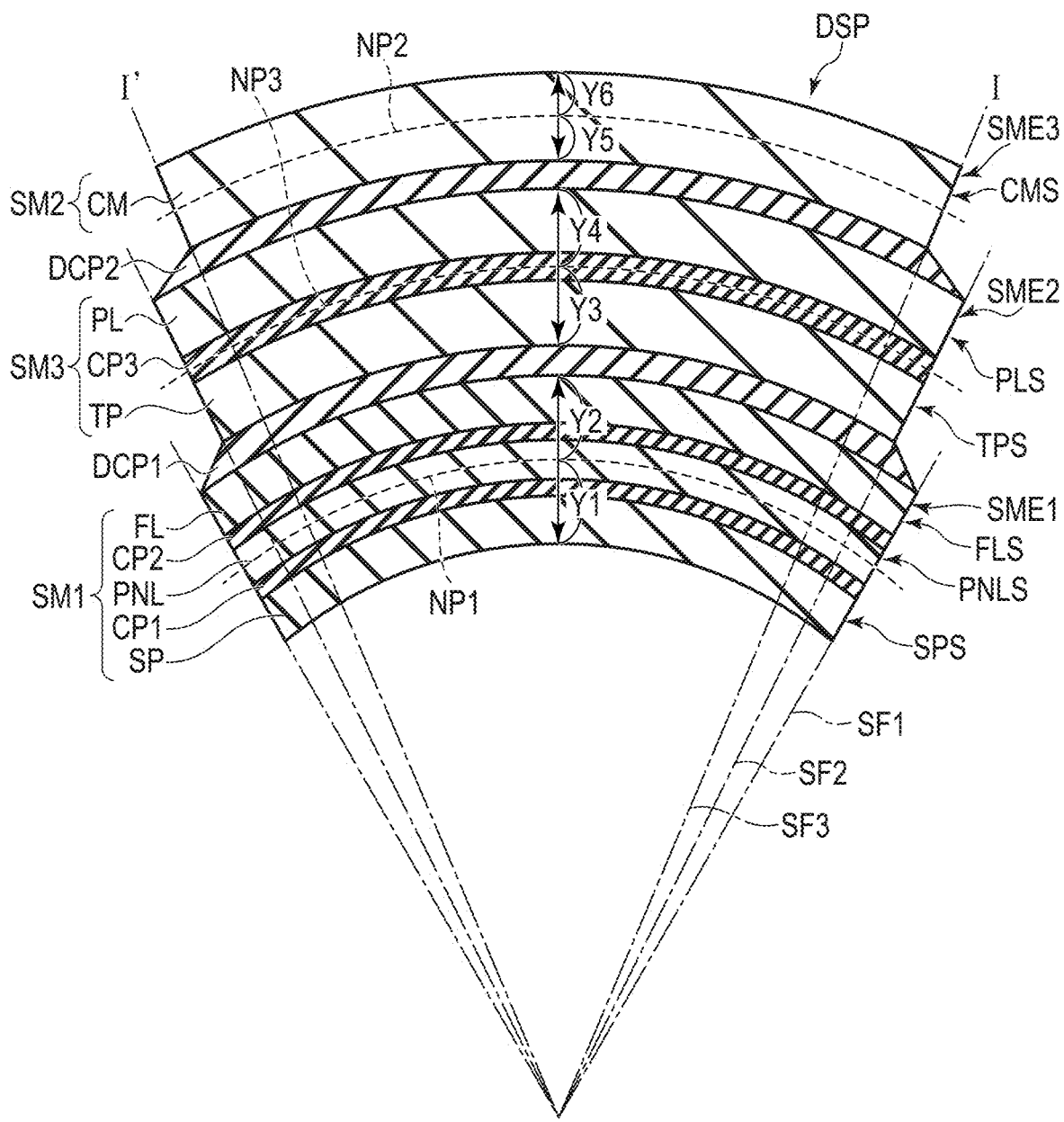
FIG. 6 is a cross-sectional view showing an area between a plane I and a plane I' in a state where a display device shown in FIG. 5 is bent.

FIG. 6 is a cross-sectional view showing an area between a plane I and a plane I' in a state where the display device DSP shown in FIG. 5 is bent. Since the display device DSP has substantially the same configuration in the plane I and the plane I', the configuration will be described by focusing on the plane I.

Here, a surface SPS of the support substrate SP, a surface PNLS of the display panel PNL, a surface FLS of the film FL, a surface TPS of the touch panel TP, a surface PLS of the polarizer PL and a surface CMS of the cover member CM correspond to a surface located in the plane I in FIG. 5.

The surface SPS, the surface PNLS and the surface FLS are located in a same plane SF1. The surface SPS, the surface PNLS and the surface FLS form a surface SME1 of the first submodule SM1. The surface TPS and the surface PLS are located in a same plane SF2. The surface TPS and the surface PLS form a surface SME2 of the second submodule SM2. The surface CMS is located in a plane SF3. The surface CMS forms a surface SME3 of the third submodule SM3. Since the decoupling layers are disposed respectively at positions between the submodules, when the display device DSP is bent, the surfaces SME1, SME2 and SME3 are not located in the same plane. In the illustrated example, the surface SME1 is located more outward than the surface SME2, and the surface SME2 is located more outward than the surface SME3.

The display device DSP has a plurality of neutral planes NP1, NP2 and NP3. Here, when an elastic modulus is E and a strain is ε, a stress σ according to a member can be expressed as σ=E×ε. That is, the stress σ is proportional to the strain ε. In addition, when a distance from a neutral plane is Y and a radius of curvature in the neutral plane is R, the strain ε is expressed as ε=Y/R. That is, the strain ε can be reduced by reducing the distance Y from the neutral plane of each member. The stress σ can be reduced by reducing the strain ε. Note that the strain ε is 0 in the neutral plane. Therefore, it is preferable to locate a member having low break strength such as an inorganic insulating film which will be described later in the neutral plane.

In the illustrated example, in the first submodule SM1, a tensile stress is maximized on the upper surface of the film FL, and a compressive stress is maximized on the lower surface of the support substrate SP. In the first submodule SM1, a distance from the neutral plane PN1 to the lower surface of the support substrate SP will be referred to as a distance Y1, and a distance from the neutral plane NP1 to the upper surface of the film FL will be referred to as a distance Y2. In the illustrated example, in the third submodule SM3, a tensile stress is maximized on the upper surface of the polarizer PL, and a compressive stress is maximized on the lower surface of the touch panel TP. In the third submodule SM3, a distance from the neutral plane NP3 to the lower surface of the touch panel TP will be referred to as a distance Y3, and a distance from the neutral plane NP3 to the upper surface of the polarizer PL will be referred to as a distance Y4. In the illustrated example, in the second submodule SM2, a tensile stress is maximized on the upper surface of the cover member CM, and a compressive stress is maximized on the lower surface of the cover member CM. In the second submodule SM2, a distance from the neutral plane NP2 to the lower surface of the cover member CM will be referred to as a distance Y5, and a distance from the neutral plane NP2 to the upper surface of the cover member CM will be referred to as a distance Y6.

In addition, when the elastic modulus is E and the thickness of the module is T, the rigidity of the module is expressed as $a \times E \times T^3$ (where a is a constant). That is, the rigidity of the module is proportional to the cube of the thickness T, and as the thickness T decreases, the rigidity decreases, accordingly. Since the first to third submodules are decoupled by the first decoupling layer DCP1 and the second decoupling layer DCP2, the rigidity of the display device DSP shown in FIG. 6 is the sum of the rigidities of the first to third submodules. When the module having the elastic modulus E and the thickness T is divided into n submodules by n−1 decoupling layers and each submodule has the elastic modulus E and a thickness T/n, the rigidity $ET^3$ which the module has before the module is divided changes to $E(T/n)^3 \times n = ET^3/n^2$ after the module is divided by the decoupling layers. That is, the rigidity can be reduced to $1/n^2$. Accordingly, the force required for bending can be reduced, and operability is improved.

Next, a comparative example of the display device DSP shown in FIG. 6 will be described.

Figure 7:
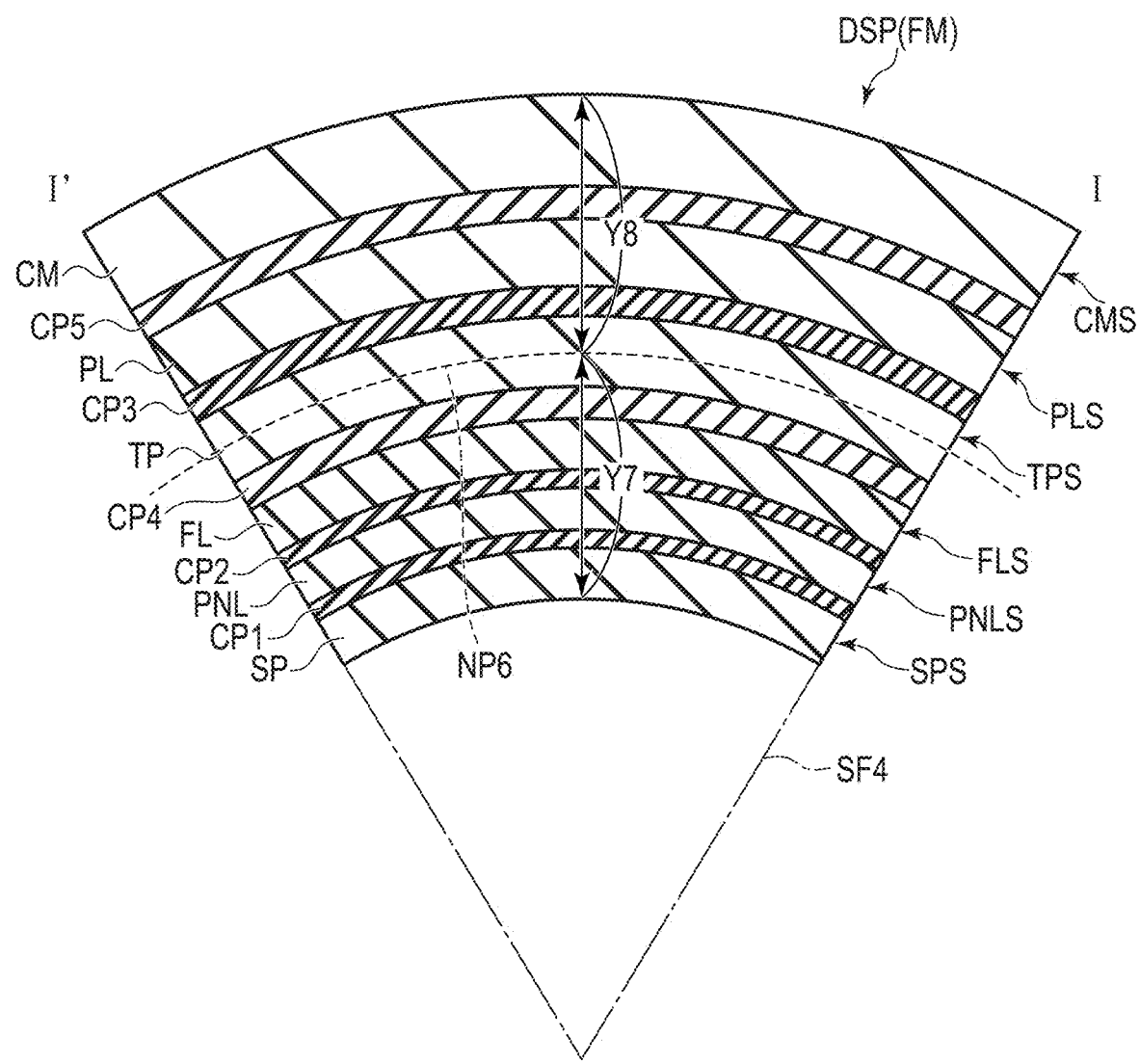
FIG. 7 is a cross-sectional view showing another example of the area between the plane I and the plane I' in a state where the display device shown in FIG. 5 is bent.

FIG. 7 is a cross-sectional view showing a comparative example of the area between the plane I and the plane I' in a state where the display device DSP shown in FIG. 5 is bent. The configuration shown in FIG. 7 differs from the configuration shown in FIG. 6 in that the display device DSP includes a fourth coupling layer CP4 and a fifth coupling layer CP5 in place of the first decoupling layer DCP1 and the second decoupling layer DCP2.

The fourth coupling layer CP4 is located between the film FL and the touch panel TP and bonds them together. The fifth coupling layer CP5 is located between the polarizer PL and the cover member CM and bonds them together.

The surface SPS, the surface PNLS, the surface FLS, the surface TPS, the surface PLS and the surface CMS are located in the same plane SF4. That is, the members constituting the display device DSP are integrated and fastened together by the first to fifth coupling layers, and the display device DSP is not divided into submodules. Therefore, the display device DSP of the comparative example has a single neutral plane NP6.

In the illustrated example, in the display device DSP, a tensile stress is maximized on the upper surface of the cover member CM, and a compressive stress is maximized on the lower surface of the support substrate SP. In the display device DSP, a distance from the neutral plane NP6 to the lower surface of the support substrate SP will be referred to as a distance Y7, and a distance from the neutral plane NP6 to the upper surface of the cover member CM will be referred to as a distance Y8.

Here, the distances Y1, Y3 and Y5 shown in FIG. 6 are less than the distance Y7 shown in FIG. 7. Since the strain ε is expressed as ε=Y/R, the maximum compressive stress of each submodule shown in FIG. 6 is less than the maximum compressive stress of FIG. 7. In addition, the distances Y2, Y4 and Y6 shown in FIG. 6 are less than the distance Y8 shown in FIG. 7. Therefore, the maximum tensile stress of each submodule shown in FIG. 6 is less than the maximum tensile stress of FIG. 7. That is, the strain is reduced in the configuration of the present embodiment shown in FIG. 6 as compared to the configuration of the comparative example shown in FIG. 7. In particular, when attention is focused on the display panel PNL, in the example shown in FIG. 6, the neutral plane NP1 is located in the display panel PNL, and the strain on the display panel PNL is therefore low. On the other hand, in the example shown in FIG. 7, the neutral plane NP6 is located away from the display panel PNL and is located in the touch panel TP, and the strain on the display panel PNL is therefore high. Note that the radius of curvature of each submodule of FIG. 6 and the radius of curvature of the display device DSP of FIG. 7 are substantially the same.

In addition, the thickness Y7+Y8 of the display device DSP shown in FIG. 7 is substantially equal to the sum of the thicknesses Y1+Y2+Y3+Y4+Y5+Y6 of the first to third submodules shown in FIG. 6. Since the display device DSP shown in FIG. 6 is divided into the first to third submodules, as described above, the rigidity is reduced as compared to the rigidity of the display device DSP shown in FIG. 7.

In the flexible module FM shown in FIG. 7, it is necessary to design a layout to locate a single neutral plane in the most fragile member in consideration of the elastic moduli and thicknesses of the constituent members. Since the number of neutral planes is one, when a new member is added, the neutral plane is shifted. Therefore, the layout must be redesigned, and design flexibility cannot be secured. In addition, as a member is located farther from the neutral plane PN6, the strain on the member becomes higher. Therefore, plastic deformation occurs, and folds may be formed or whitening may occur. Furthermore, rigidity is increased, and operability for bending is degraded.

According to the present embodiment, the flexible module FM includes a decoupling layer DCP and a plurality of submodules. That is, the flexible module FM has a plurality of neutral planes. Therefore, as compared to a case where the number of neutral planes of the flexible module FM is one, the strain according to the entire flexible module FM can be reduced. Consequently, even when repeatedly bent, degradation in performance such as plastic deformation or damage of members can be suppressed. In addition, since a neutral plane can be controlled for each submodule, damage of members can be suppressed by locating a neutral plane in a member having particularly low break strength in each submodule. Furthermore, since a strain can be reduced, a radius of curvature can be reduced. Furthermore, when the flexible module FM is bent, as shown in FIG. 6, the surfaces SME1, SME2 and SME3 of the respective submodules are slid (shifted). As a result, the rigidity can be reduced, and the bend operation can be smoothly performed.

Figure 8:
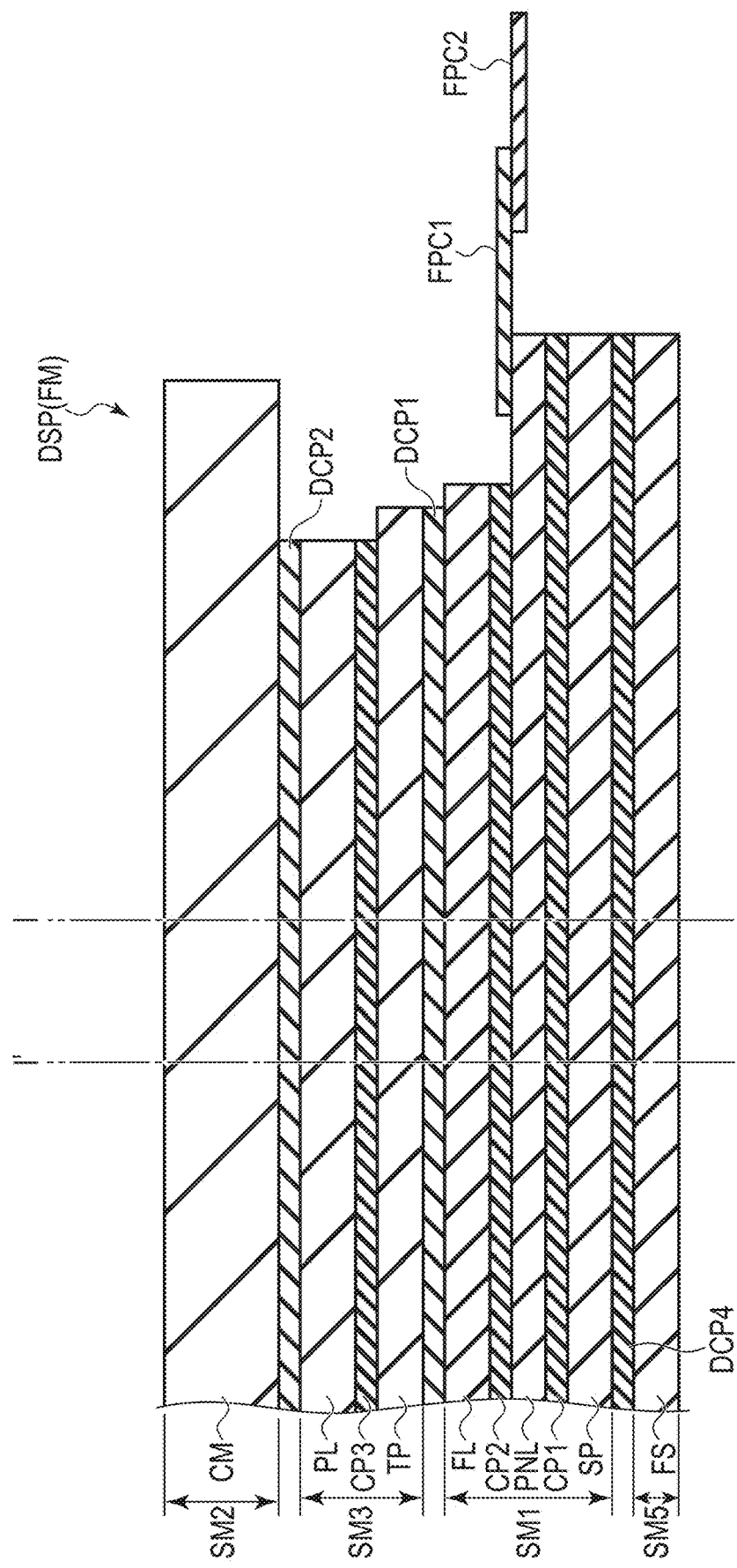
FIG. 8 is a cross-sectional view showing a practical example of the flexible module according to the present embodiment.

FIG. 8 is a cross-sectional view showing a practical example of the flexible module FM according to the present embodiment. The configuration shown in FIG. 8 differs from the configuration shown in FIG. 5 in that the flexible module FM includes a function sheet FS and a fourth decoupling layer DCP4.

The function sheet FS includes, for example, at least one of a heat dissipation sheet which dissipates heat from the module, a force feedback sheet, an illumination device, a buffer sheet which protects the module from an external force, and an electromagnetic induction sensor sheet which is disposed in the module employing a stylus input method. In the present embodiment, even if a new submodule is added, the neutral planes of the existing submodules do not change. Therefore, the design flexibility can be improved. For example, an external touch panel, a polarizer, a function sheet, etc., may be added to the existing layout via a decoupling layer afterward, or a function sheet, etc., disposed via a decoupling layer may be removed.

Figure 9:
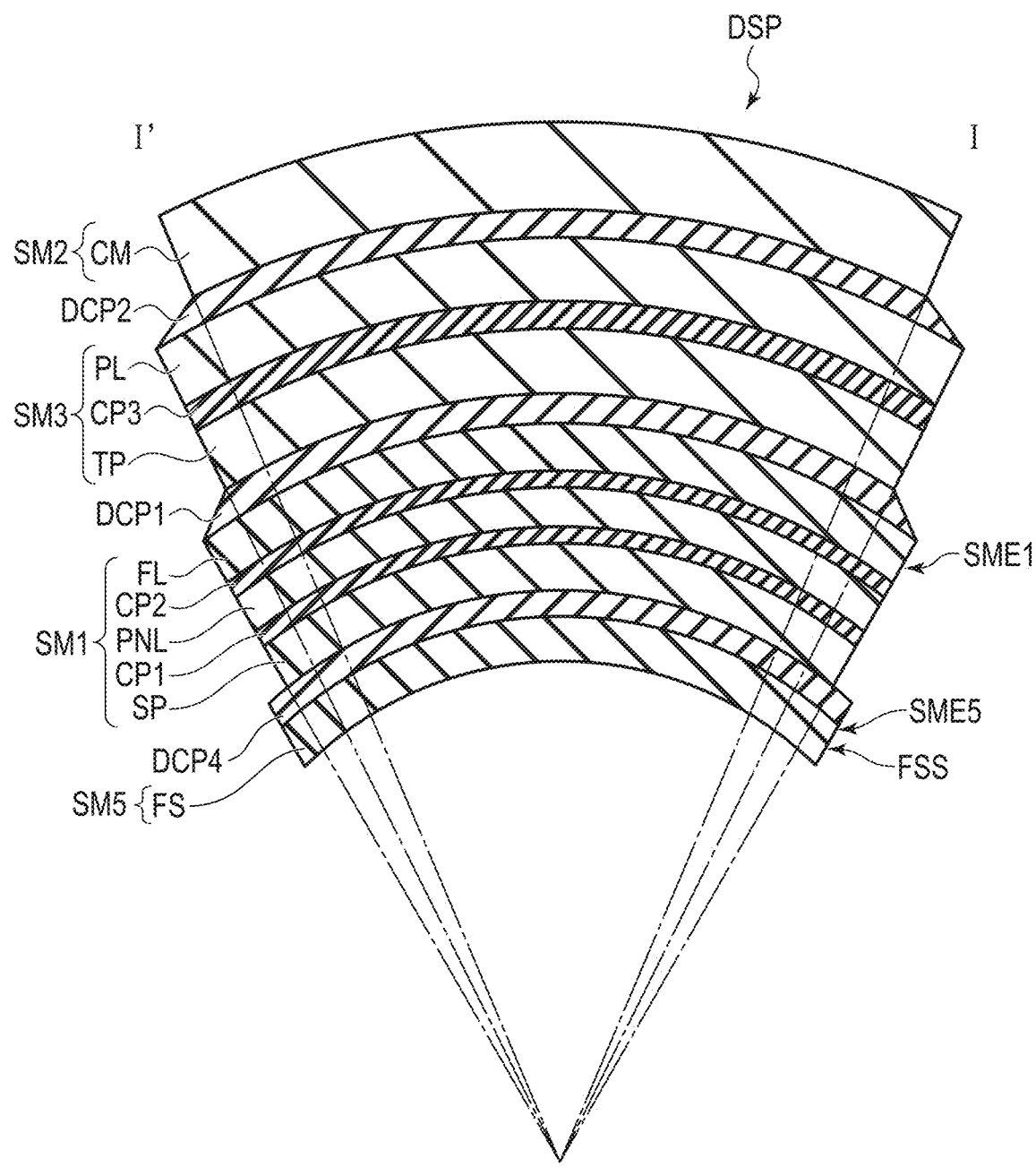
FIG. 9 is a cross-sectional view showing an area between a plane I and a plane I' in a state where a display device shown in FIG. 8 is bent.

FIG. 9 shows a cross-sectional view showing an area between a plane I and a plane I' in a state where the display device DSP shown in FIG. 8 is bent. Here, a surface FSS of the function sheet FS corresponds to a surface located in the plane I in FIG. 8.

The surface FSS forms a surface SMES of the fifth submodule SM5. In the illustrated example, the surface SMES is located more outward than the surface SME1. As shown in the drawing, even when the fifth submodule SM5 is added afterward, an increase in strain on the other submodules can be suppressed. In addition, since the function sheet FS is bonded to the support substrate SP by the fourth decoupling layer DCP4, an increase in rigidity can be suppressed as compared to a case where the function sheet FS is bonded to the support substrate SP by a coupling layer. Note that the display device DSP may include a submodule including a force feedback device.

FIG. 10 is a plan view showing the configuration of the decoupling layer DCP. The configuration of the decoupling layer DCP described below can be applied to the configuration of any one of the first to fourth decoupling layers described above.

The decoupling layer DCP is formed of at least one of a first material D1 which is a non-linear elastic solid and a second material D2 which is a viscous fluid. Note that the decoupling layer DCP may contain both the first material D1 and the second material D2.

The elastic modulus of the first material D1 is less than or equal to 100 KPa, preferably, less than or equal to 10 KPa. Here, the elastic modulus particularly indicates a shear modulus, a tensile storage modulus and a shear storage modulus. The first material D1 needs to be highly adherent to the submodules SM disposed above and below it and also needs to be highly deformable. For example, the amount of deformation is, when expressed as a tensile elastic modulus, greater than or equal to 150%, preferably, greater than or equal to 200%. By using the first material D1 which is a non-linear elastic solid for the decoupling layer DCP, it is possible to impart resilience, which is the ability to return to a state of the flexible module FM before the flexible module FM is bent, to the flexible module FM. The thickness of the decoupling layer is 10 μm to 250 μm, preferably, 25 μm to 100 μm.

The first material D1 is an elastic adhesive formed of, for example, a material containing acrylic resin, silicon resin, polyurethane resin, natural rubber, synthetic resin or the like. In addition, the first material D1 exhibits a rubber state in the operation temperature range of the flexible module FM. Note that the operation temperature range here is, for example, 0 to 50° C. The first material D1 is formed by, for example, room-temperature curing, thermal curing or UV curing. When the first material D1 is formed by thermal curing, resin to be used is preferably resin which is cured at a temperature of less than or equal to 100° C. The first material D1 is formed by, for example, lamination such as atmospheric lamination or vacuum lamination, coating by a jet dispenser or an ink jet, or photolithography when resin to be used is photosensitive resin.

The viscosity of the second material D2 is greater than or equal to 100 cP, preferably, greater than or equal to 1000 cP. By using the second material D2 for the decoupling layer DCP, it is possible to impart flexibility of the bend operation of the flexible module FM.

The second material D2 is formed of a material containing polymer, polymer mixture, polymer gel, etc. Alternatively, the second material D2 may be air. Note that examples of the viscous fluid used for the second material D2 are a Newtonian fluid and a non-Newtonian fluid which will be described later.

The ratio of materials used for the decoupling layer DCP or its composition is selected by putting importance on the restoration of the position of each member after the flexible module FM is bent or the flexibility of the bend operation. For example, when importance is put on the restoration of the position of each member, the material used for the decoupling layer is a non-linear elastic solid. Alternatively, when importance is put on not the restoration of the position but the flexibility of the operation, a viscous fluid is used. To adjust the elastic modulus of the entire layer, the decoupling layer DCP may use a plurality of first materials D1 having different elastic moduli or may use both the first material D1 and the second material D2. When both the first material D1 and the second material D2 are used for the decoupling layer DCP, the restoration of the position can be secured by a non-linear elastic solid and the operability can be controlled by a viscous fluid. Note that a plurality of different materials which are linear elastic solids may be used or a plurality of different materials which are viscous fluids may be used.

In FIG. 10, the first material D1 is indicated by diagonal lines slanting upward to the right. In the example shown in (a) of FIG. 10, the first material D1 is disposed in the entire decoupling layer DCP. In the example shown in (b) of FIG. 10, the first material D1 is disposed in an area located more leftward than the bend axis BA, and the second material D2 is disposed in an area in which the first material D1 is not disposed of the decoupling layer DCP. Note that the flexible module FM is bent along the bend axis BA.

FIG. 11 is a plan view showing the configuration of the decoupling layer DCP. In the example shown in (a) of FIG. 11, three linear first materials D1 are formed and extend along the second direction Y. In the example shown in (b) of FIG. 11, dot-shaped first materials D1 are disposed. In (a) of FIG. 11 and (b) of FIG. 11, the second material D2 is disposed in an area in which the first materials D1 are not disposed of the decoupling layer DCP.

FIG. 12 is an illustration showing the position of a driver IC.

In the example shown in (a) of FIG. 12, in the same manner as the configuration shown in (a) of FIG. 11, three linear first materials D1 are formed and extend along the second direction Y. The driver IC is mounted on a side along the first direction X of the flexible module FM. That is, the driver IC is mounted on a side of the flexible module FM which extends in a direction orthogonal to a direction in which the first materials D1 extend. In the example shown in (b) of FIG. 12, the driver IC is mounted on the wiring substrate FPC1. In addition, the first submodule SM1 is bent such that the wiring substrates FPC1 and FPC2 are located below the first submodule SM1.

FIG. 13 is a cross-sectional view showing another configuration of the flexible module FM. The configuration shown in FIG. 13 differs from the configuration shown in FIG. 1 in that the flexible module FM includes a coupling portion C.

The coupling portion C is located between the first submodule SM1 and the second submodule SM2. That is, the coupling portion C is disposed in the same layer as the first decoupling layer DCP1. The coupling portion C is formed of substantially the same material and by substantially the same manufacturing method as the above-described coupling layers.

Figure 14:
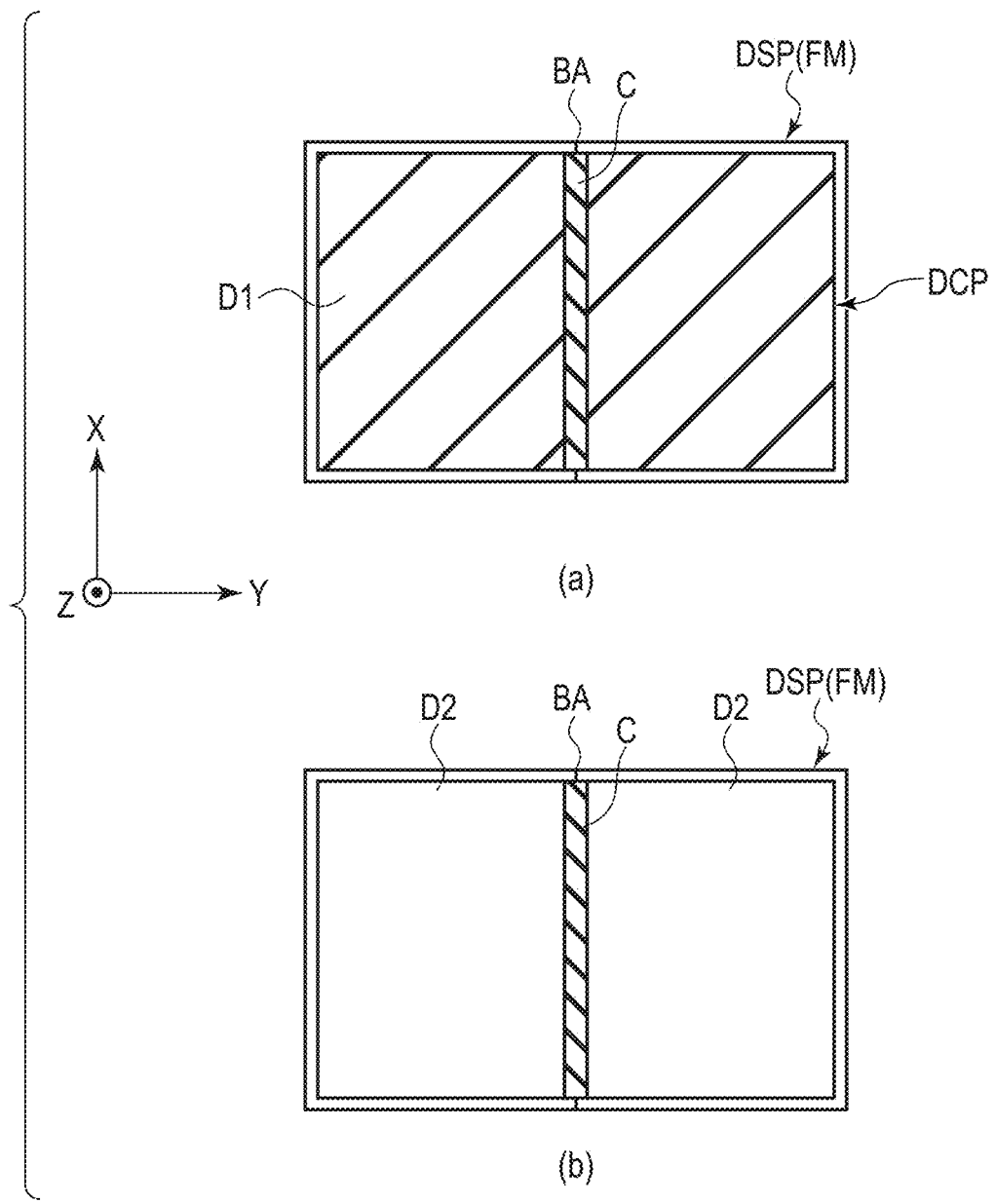
FIG. 14 is a plan view showing the configuration of a first decoupling layer shown in FIG. 13.

FIG. 14 is a plan view showing the configuration of the first decoupling layer DCP1 shown in FIG. 13.

In FIG. 14, the coupling portion C is indicated by diagonal lines slanting upward to the left. In the example shown in (a) of FIG. 14, the coupling portion C is disposed along the first direction X on the bend axis BA. The decoupling layer DCP is formed only of the first material D1, and the first material D1 is disposed in an area in which the coupling portion C is not disposed. The configuration shown in (b) of FIG. 14 differs from the configuration shown in (a) of FIG. 14 in the material of the first decoupling layer DCP1. The decoupling layer DCP is formed only of the second material D2, and the second material D2 is disposed in an area in which the coupling portion C is not disposed.

Figure 15:
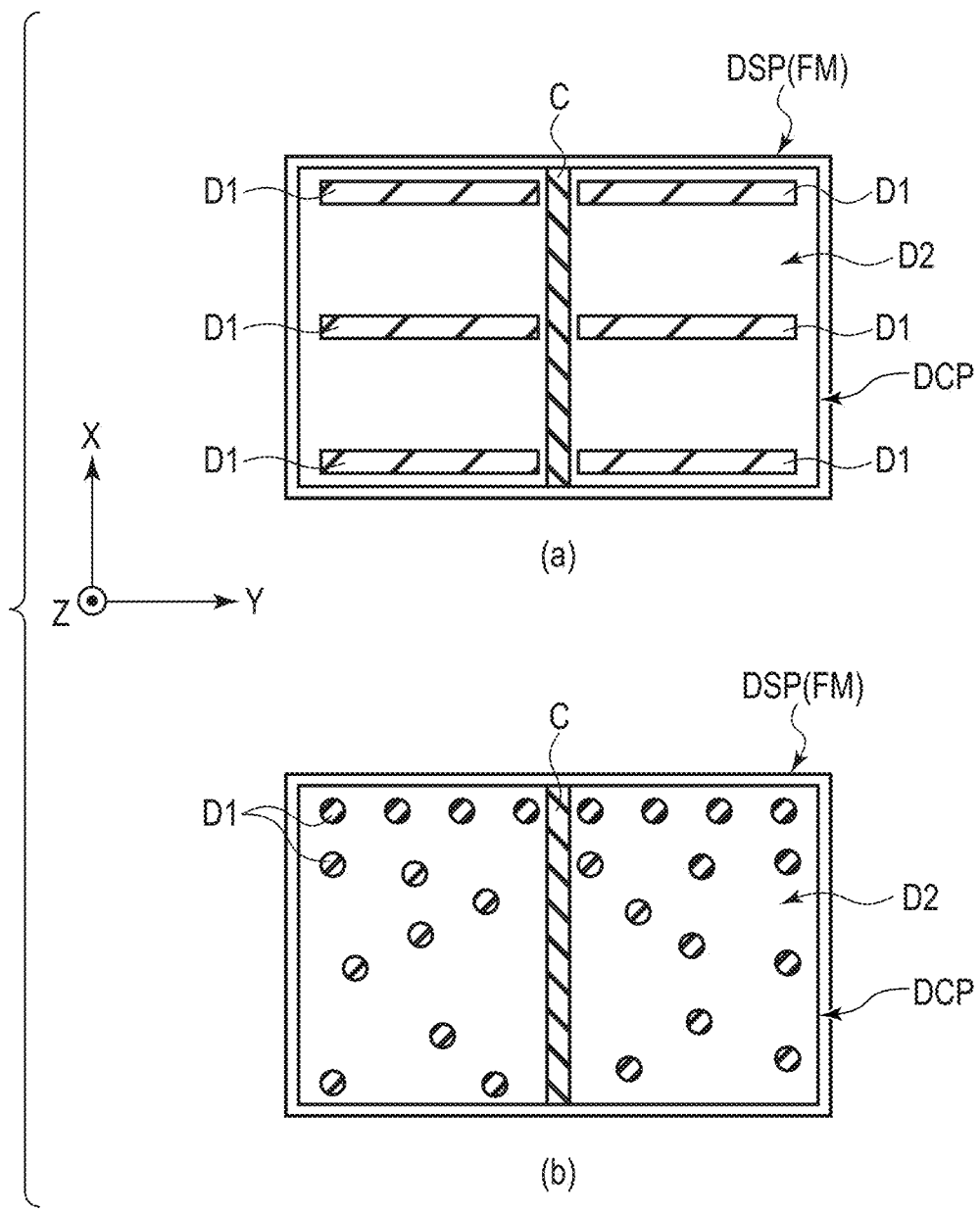
FIG. 15 is a plan view showing the configuration of the first decoupling layer shown in FIG. 13

FIG. 15 is a plan view showing the configuration of the first decoupling layer DCP1 shown in FIG. 13. The configurations shown in (a) of FIG. 15 and (b) of FIG. 15 differ from the configuration shown in (a) of FIG. 14 in the configuration of the first decoupling layer DCP1. The decoupling layers DCP shown in (a) of FIG. 15 and (b) of FIG. 15 are formed of the first material D1 and the second material D2. In the example shown in (a) of FIG. 15, six linear first materials D1 are formed and extend along the second direction Y in an area in which the coupling portion C is not disposed. In the example shown in (b) of FIG. 15, dot-shaped first materials D1 are disposed in an area in which the coupling portion C is not disposed. In addition, in (a) of FIG. 15 and (b) of FIG. 15, the second material D2 is disposed in an area in which the coupling portion C and the first materials D1 are not disposed of the first decoupling layer DCP1.

Figure 16:
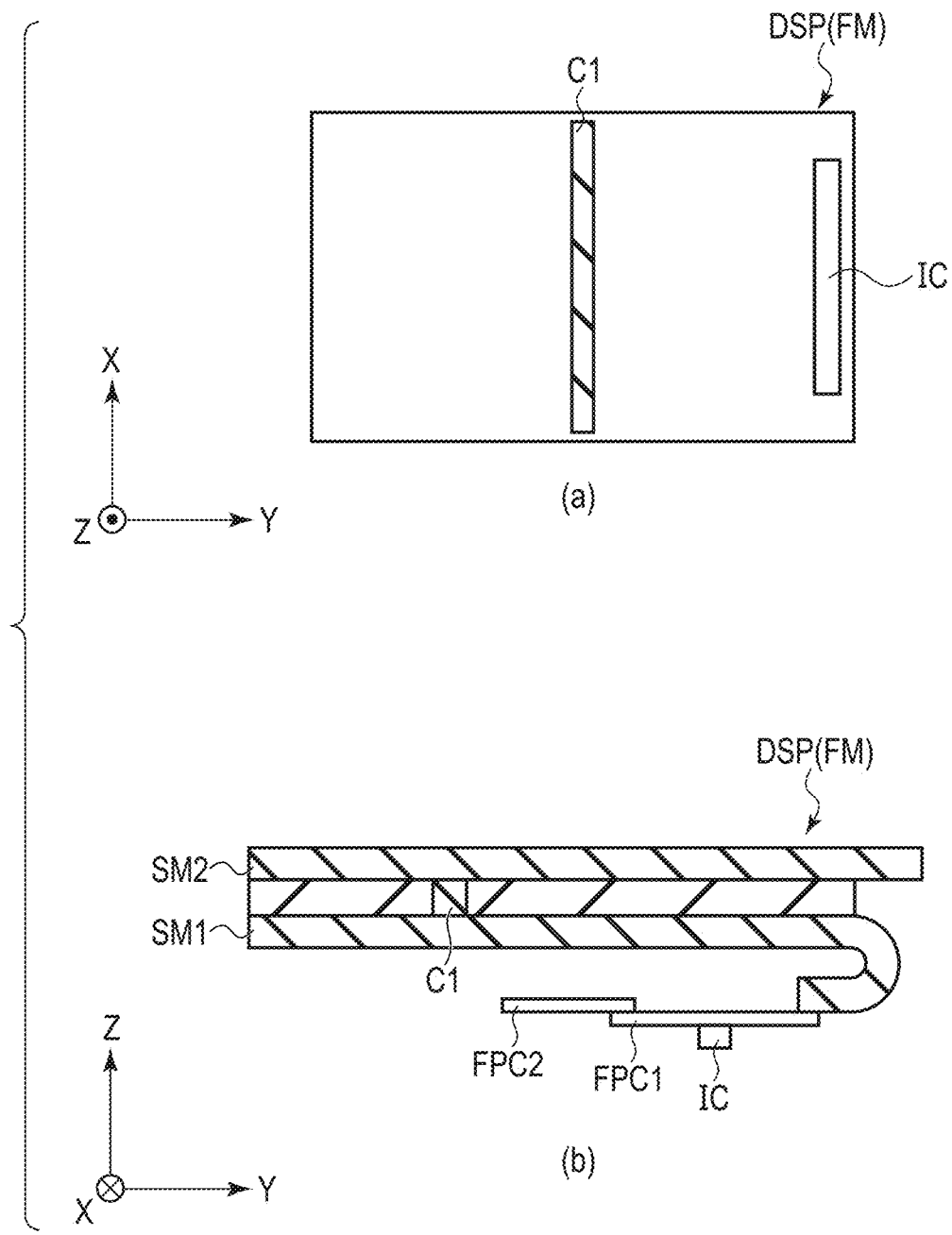
FIG. 16 is an illustration showing the position of the driver.

FIG. 16 is an illustration showing the position of the driver IC.

In the example shown in (a) of FIG. 16, in the same manner as the configuration shown in (a) of FIG. 14, the coupling portion C extends along the first direction X. The driver IC is mounted on a side along the first direction X of the flexible module FM. That is, the driver IC is mounted along a side of the flexible module FM which extends in a direction parallel to a direction in which the coupling portion C extends. In the example shown in (b) of FIG. 16, the driver IC is mounted on the wiring substrate FPC1. In addition, the first submodule SM1 is bent such that the wiring substrates FPC1 and FPC2 are located below the first submodule SM1.

Figure 17:
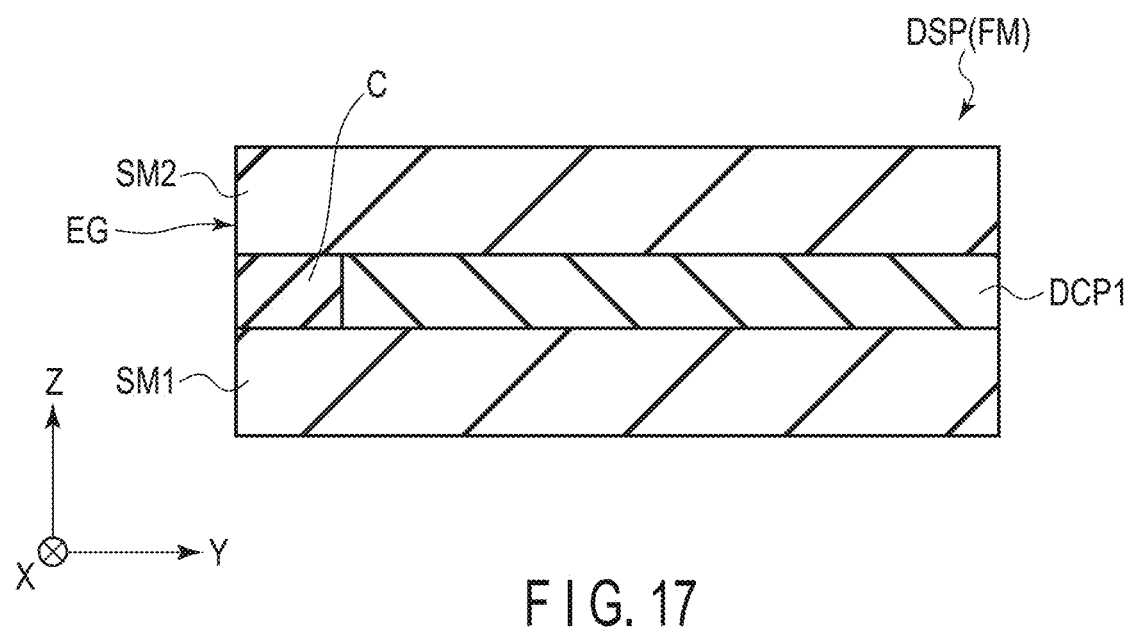
FIG. 17 is a cross-sectional view showing another configuration of the flexible module.

FIG. 17 is a cross-sectional view showing another configuration of the flexible module FM. The configuration shown in FIG. 17 differs from the configuration shown in FIG. 13 in the deposition position of the coupling portion C.

In the example shown in FIG. 17, the coupling portion C is disposed along an edge EG of the flexible module FM. The coupling portion C is located closer to the edge EG than the first decoupling layer DCP1.

Figure 18:
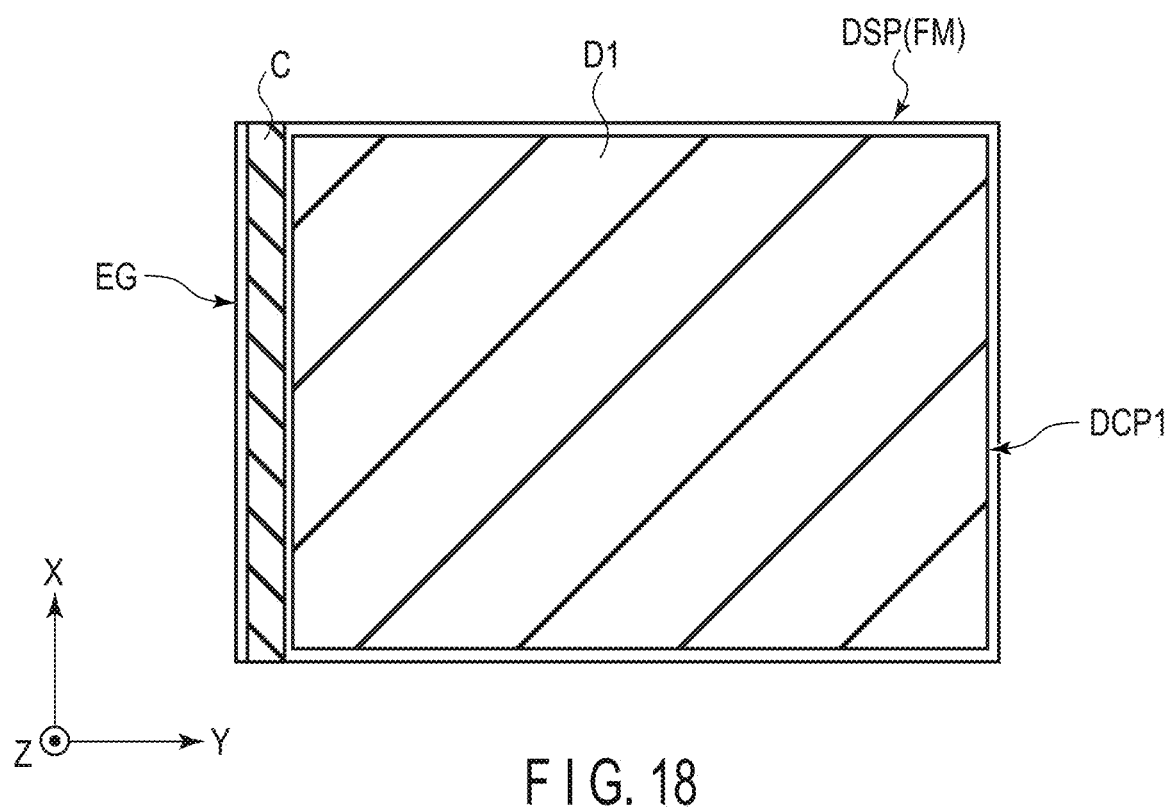
FIG. 18 is a plan view showing the configuration of a first decoupling layer shown in FIG. 17.

FIG. 18 is a plan view showing the configuration of the first decoupling layer DCP1 shown in FIG. 17.

In the example shown in FIG. 18, the coupling portion C is arranged along the first direction X on the edge EG side of the flexible module FM. The first decoupling layer DCP1 is formed only of the first material D1, and the first material D1 is disposed in an area in which the coupling portion C is not disposed. Note that only the second material D2 may be disposed in the first decoupling layer DCP1, or both the first material D1 and the second material D2 may be disposed in the first decoupling layer DPC1.

Figure 19:
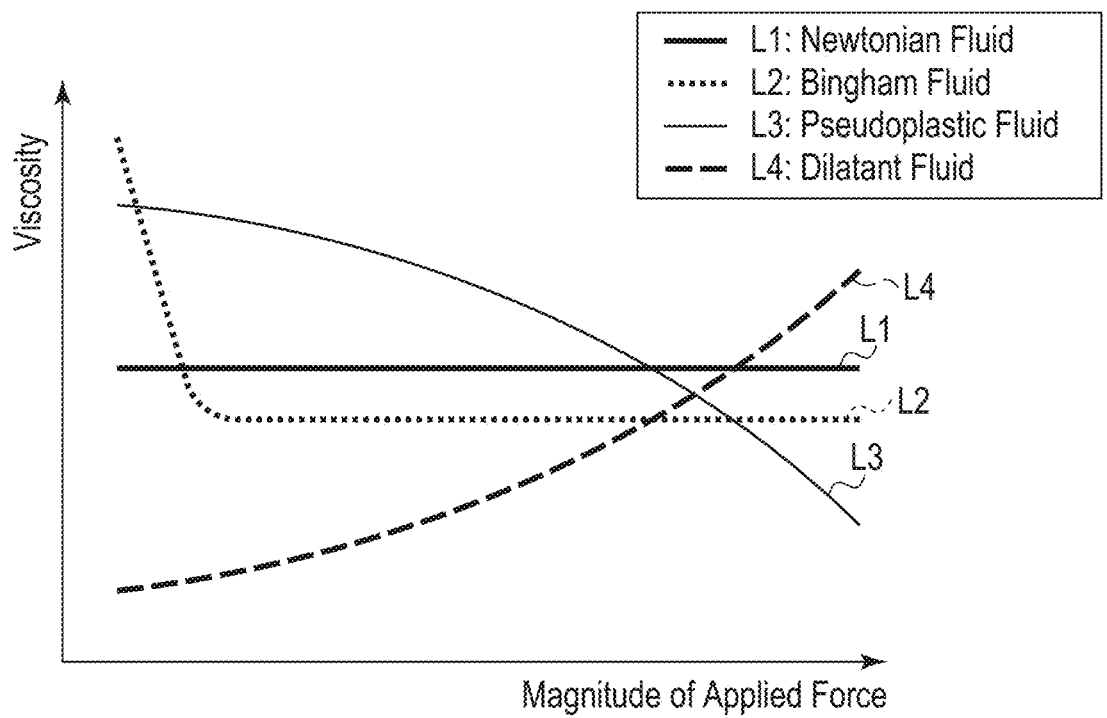
FIG. 19 is an illustration showing the properties of a viscous fluid used for the decoupling layer.

FIG. 19 is an illustration showing the properties of the viscous fluid used for the decoupling layer. Examples of the viscous fluid used as the second member are a Newtonian fluid and a non-Newtonian fluid. Here, a Bingham fluid, a pseudoplastic fluid and a dilatant fluid are shown as non-Newtonian fluids. In FIG. 19, the horizontal axis shows the magnitude of a force applied to the viscous fluid, and the vertical axis shows the viscosity of the viscous fluid. In addition, a line L1 shows the Newtonian fluid, a line L2 shows the Bingham fluid, a line L3 shows the pseudoplastic fluid, and a line L4 shows the dilatant fluid.

As shown by the line L1, the viscosity of the Newtonian fluid is constant regardless of the magnitude of the applied force. That is, the viscosity of the Newtonian fluid does not change depending on the shifting speed of the member.

As shown by the line L2, the viscosity of the Bingham fluid is higher than that of the Newtonian fluid when the magnitude of the applied force is less than or equal to a certain value, and the viscosity of the Bingham fluid is maintained in a state lower than that of the Newtonian fluid when the magnitude of the applied force is greater than or equal to the certain value. That is, since the Bingham fluid does not move until the threshold of the magnitude of the force of greater than or equal to the certain value, for example, display can be viewed while the bent state or flat state of the display device is maintained.

As shown by the line L3, the viscosity of the pseudoplastic fluid increases as the magnitude of the applied force decreases, and the viscosity of the pseudoplastic fluid decreases as the magnitude of the applied force increases. That is, for example, the pseudoplastic fluid can impart operability, which is the ability to move slower when the user wants to move the flexible module slow and move faster when the user wants to move the flexible module fast, to the flexible module.

As shown by the line L4, the viscosity of the dilatant fluid decreases as the magnitude of the applied force decreases, and the viscosity of the dilatant fluid increases as the magnitude of the applied force increases. That is, the dilatant fluid can impart, for example, the usage of a protection function against an unintended movement such as a drop impact to the flexible module.

In the present embodiment, the display device DSP will be hereinafter described based on the assumption that the display device DSP is an organic electroluminescent display device.

Figure 20:
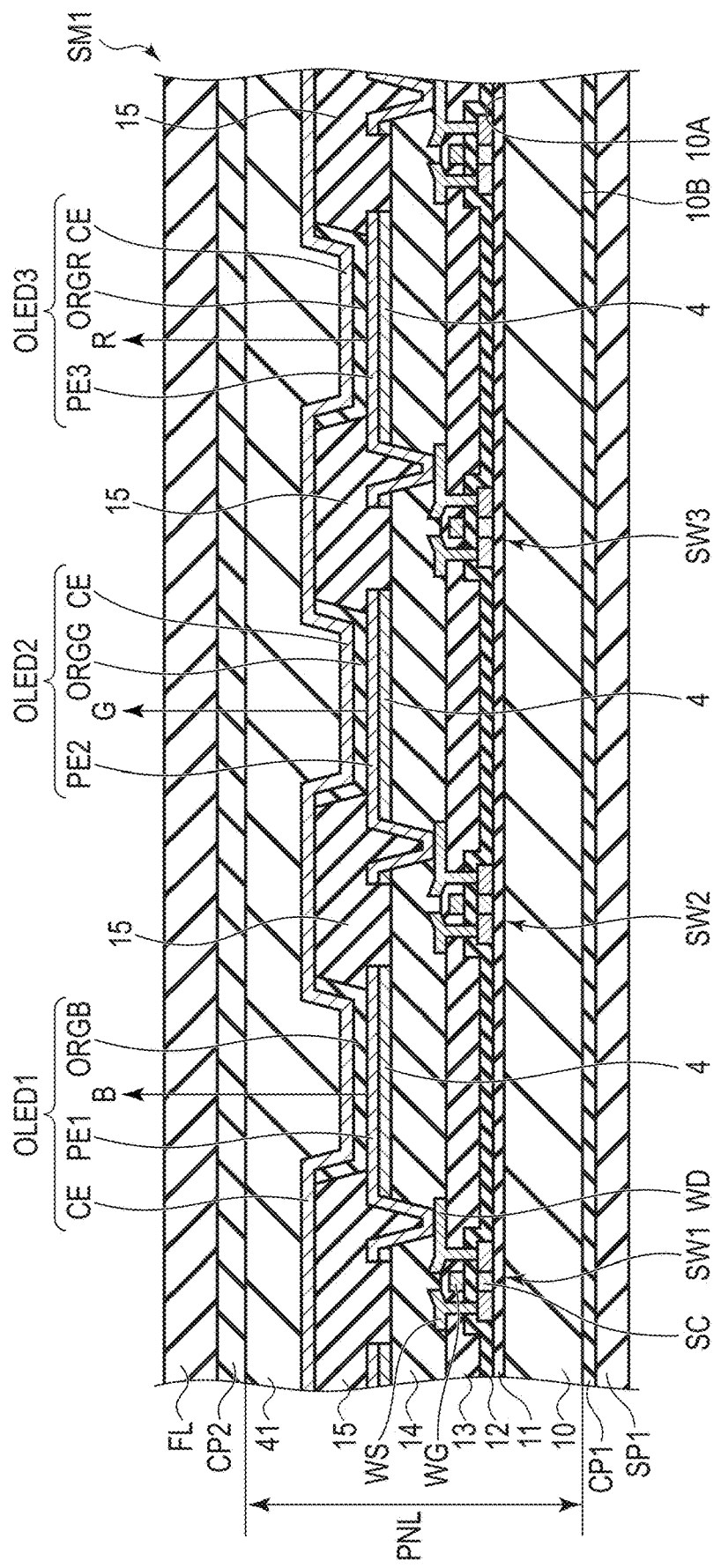
FIG. 20 is a cross-sectional view showing the detailed configuration of a first submodule shown in FIG. 5.

FIG. 20 is a cross-sectional view showing the detailed configuration of the first submodule SM1 shown in FIG. 5.

As shown in FIG. 20, the first submodule SM1 includes the display panel PNL, the support substrate SP, the film FL, the first coupling layer CP1 and the second coupling layer CP2.

The display panel PNL includes an insulating substrate 10, switching elements SW1, SW2 and SW3, a reflective layer 4, organic EL elements OLED1, OLED2 and OLED3, a sealing layer 41 and the like.

The insulating substrate 10 is formed of an organic insulating material, and is formed of, for example, polyimide. The insulating substrate 10 is covered with a first insulating film 11.

The switching elements SW1, SW2 and SW3 are formed on the first insulating film 11. The switching elements SW1, SW2 and SW3 are formed of a top-gate thin-film transistor in the illustrated example but may be formed of a bottom-gate thin-film transistor. Since the switching elements SW1, SW2 and SW3 have the same configuration, the configuration will be described in detail by focusing on the switching element SW1. The switching element SW1 includes a semiconductor layer SC formed on the first insulating film 11. The semiconductor layer SC is covered with a second insulating film 12. In addition, the second insulating film 12 is also disposed on the first insulating film 11.

A gate electrode WG of the switching element SW1 is formed on the second insulating film 12 and is located directly above the semiconductor layer SC. The gate electrode WG is covered with a third insulating film 13. In addition, the third insulating film 13 is also disposed on the second insulating film 12.

The first insulating film 11, the second insulating film 12 and the third insulating film 13 are, for example, inorganic insulating films formed of an inorganic material such as silicon oxide or silicon nitride.

A source electrode WS and a drain electrode WD of the switching element SW1 are formed on the third insulating film 13. The source electrode WS and the drain electrode WD are electrically connected to the semiconductor layer SC though contact holes which penetrate the second insulating film 12 and the third insulating film 13, respectively. The switching element SW1 is covered with a fourth insulating film 14. The fourth insulating film 14 is also disposed on the third insulating film 13. The fourth insulating film 14 is formed of, for example, a transparent organic material such as resin.

The reflective layer 4 is formed on the fourth insulating film 14. The reflective layer 4 is formed of a metal material having high light reflectance such as aluminum or silver. Note that the reflective layer 4 may be formed of molybdenum, chromium or the like. In addition, the upper surface of the reflective layer 4 may be a flat surface or may be an uneven surface to impart light scattering properties.

The organic EL elements OLED1 to OLED3 are formed on the fourth insulating film 14. That is, the organic EL elements OLED1 to OLED3 are located between the insulating substrate 10 and the film FL. In the illustrated example, the organic EL element OLED1 is electrically connected to the switching element SW1, the organic EL element OLED2 is electrically connected to the switching element SW2, and the organic EL element OLED3 is electrically connected to the switching element SW3. The organic EL elements OLED1 to OLED3 are formed as top-emission organic EL elements which emit red light, blue light and green light, respectively, toward the film FL side. The organic EL elements OLED1 to OLED3 have the same structure. In the illustrated example, the organic EL elements OLED1 to OLED3 are delimited by ribs 15.

The organic EL element OLED1 includes a pixel electrode (anode) PE1 formed on the reflective layer 4. The pixel electrode PE1 is in contact with the drain electrode WD of the switching element SW1 and is electrically connected to the switching element SW1. Similarly, the organic EL element OLED2 includes a pixel electrode PE2 electrically connected to the switching element SW2, and the organic EL element OLED3 includes a pixel electrode PE3 electrically connected to the switching element SW3. The pixel electrodes PE1, PE2 and PE3 are formed of, for example, a transparent conductive material such as indium tin oxide (ITO) or indium zinc oxide (IZO). In addition, although a top-emission type is applied here, a bottom-emission type may be applied instead. In that case, a common electrode (cathode) which will be described later may be formed of LiF/Al and may be provided with a reflection function in place of the reflection layer 4.

For example, the organic EL element OLED1 includes an organic light-emitting layer ORGB which emits blue light, the organic EL element OLED2 includes an organic light-emitting layer ORGG which emits green light, and the organic EL element OLED3 includes an organic light-emitting layer ORGR which emits red light. The organic light-emitting layer ORGB is located on the pixel electrode PE1, the organic light-emitting layer ORGG is located on the pixel electrode PE2, and the organic light-emitting layer ORGR is located on the pixel electrode PE3. In addition, the organic EL elements OLED1 to OLED3 include the common electrode CE. The common electrode CE is located on the organic light-emitting layers ORGB, ORGG and ORGR. The common electrode CE is also located on the ribs 15. The common electrode CE (cathode) is formed of, for example, a transparent conductive material made by combining Mg or Ag having a small work function, Mg—Ag or the like and ITO, IZO or the like. Note that, if an organic EL element has a structure opposite to the above-described structure in which a pixel electrode is a cathode and a common electrode is an anode, the pixel electrode is formed of the above-described cathode material, and the common electrode is formed of the above-described anode material.

The sealing layer 41 covers the organic EL elements OLED1, OLED2 and OLED3. The sealing layer 41 seals the members disposed between the insulating substrate 10 and the sealing layer 41. The sealing layer 41 suppresses intrusion of oxygen and moisture into the organic EL elements OLED1, OLED2 and OLED3, and suppresses degradation of the organic EL elements OLED1, OLED2 and OLED3. Note that the sealing layer 41 may be formed of a multilayer stack of an inorganic film and an organic film.

The film FL is located on the sealing layer 41 and is bonded to the sealing layer 41 by the second coupling layer CP2.

The support substrate SP is located below the insulating substrate 10 and is bonded to the insulating substrate 10 by the first coupling layer CP1. The first coupling layer CP1 is located between the insulating substrate 10 and the support substrate SP. For example, the material of the support substrate SP is preferably a material which is excellent in thermal resistance, gas insulation, moisture insulation and strength and is also inexpensive. The support substrate SP has, for example, such a degree of thermal resistance that the support substrate SP is not degraded or deformed at a process temperature in the process of manufacturing the display device DSP. In addition, the support substrate SP has, for example, a strength greater than that of the insulating substrate 10, and functions as a support layer which suppresses curving of the display panel PNL in a state where the display panel PNL is not subjected to an external stress. Furthermore, the support substrate SP may have, for example, moisture insulating properties to suppress intrusion of moisture and the like into the insulating substrate 10 and gas insulating properties to suppress intrusion of gas into the insulating substrate 10.

In this display device DSP, when the organic EL elements OLED1 to OLED3 emit light, the organic EL element OLED1 emits blue light, the organic EL element OLED2 emits green light, and the organic EL element OLED3 emits red light. Accordingly, color display of the display device DSP is realized.

Note that the organic EL elements OLED1 to OLED3 include the organic light-emitting layer ORGB which emits blue light, the organic light-emitting layer ORGG which emits green light, and the organic light-emitting layer ORGR which emits red light, respectively, in the above-described configuration example but are not limited to this example. The organic EL elements OLED1 to OLED3 may include a common organic light-emitting layer. In that case, for example, the organic EL elements OLED1 to OLED3 emit white light. In this configuration example, a color filter layer is disposed on the sealing layer 41.

In the first submodule SM1 having the configuration shown in FIG. 20, it is preferable that the neutral plane should be formed in, for example, the inorganic film of the sealing layer 41 or the first insulating film 11. Alternatively, the neutral plane may be formed between the inorganic film of the sealing layer 41 and the first insulating film 11.

The above-described embodiment is not limited to an organic electroluminescent display device but can be applied to a liquid crystal display device. In that case, the display panel PNL is, for example, a liquid crystal display panel including a first substrate, a second substrate disposed more upward than the first substrate, and a liquid crystal layer held between the first substrate and the second substrate. In a case where the display panel PNL is a liquid crystal display panel, the display panel PNL may be a reflective type which displays images by selectively reflecting light entering from the second substrate side or may be a transmissive type which displays images by selectively transmitting light entering from the first substrate side. Note that, also when the display device DSP is a liquid crystal display device, the main configuration related to the present embodiment is substantially the same.

Figure 21:
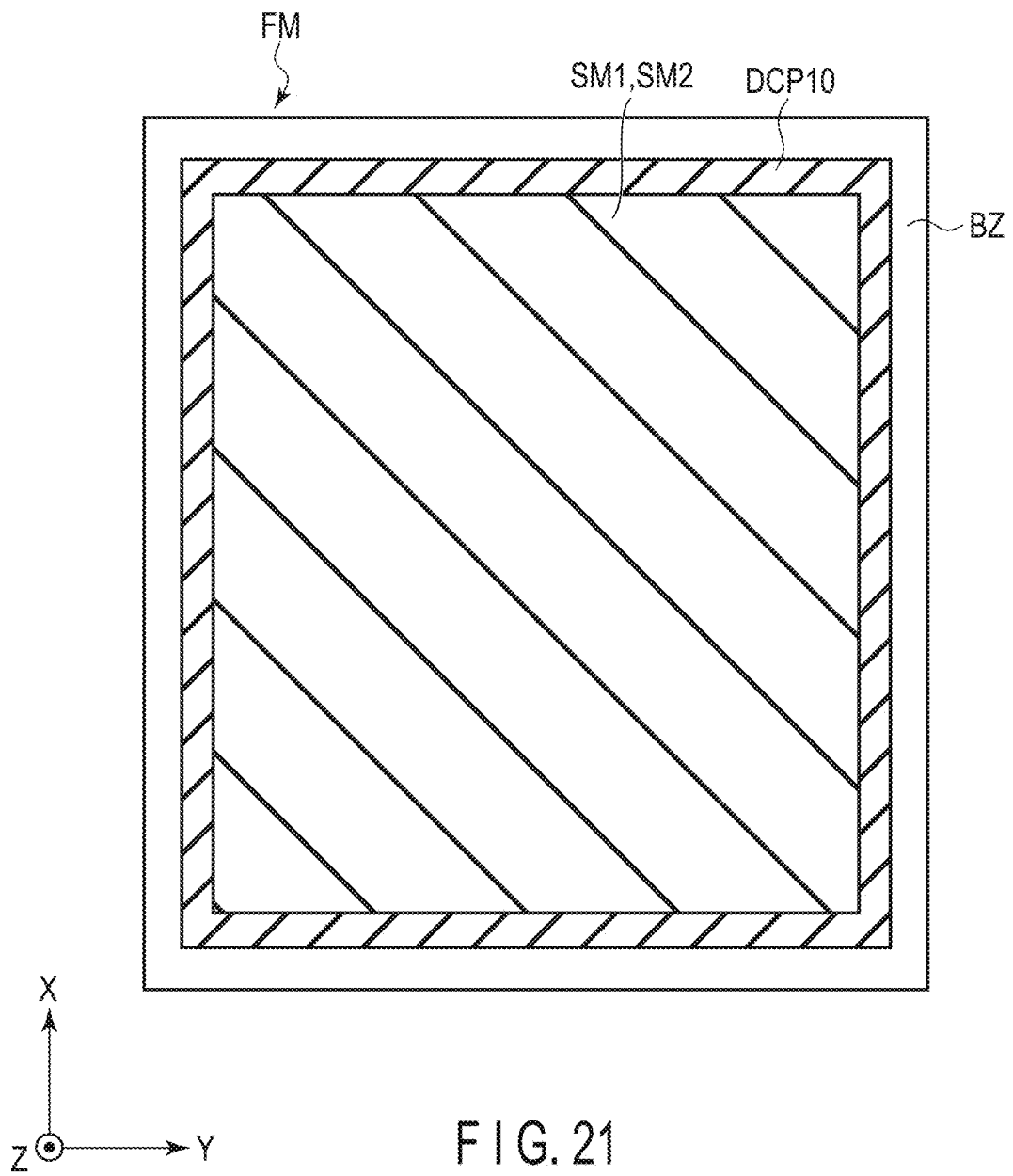
FIG. 21 is a plan view showing the positional relationship among the first submodule, a second submodule and a housing.

FIG. 21 is a plan view showing the positional relationship among the first submodule SM1, the second submodule SM2 and a housing BZ.

The housing BZ accommodates the first submodule SM1 and the second submodule SM2. A decoupling layer DCP10 is located between the first submodule SM1 and the housing BZ and between the second submodule SM2 and the first submodule SM1. When the flexible module FM is bent, the stresses in the first submodule SM1 and the second submodule SM2 are decoupled by the decoupling layer DCP10. Therefore, the stress in each of the first submodule SM1 and the second submodule SM2 and the stress in the housing BZ are prevented from affecting each other.

As described above, according to the present embodiment, a display device which can suppress degradation in performance can be obtained.

Next, as the condition of the decoupling layer, the definition of a coupling coefficient will be described.

Figure 22:
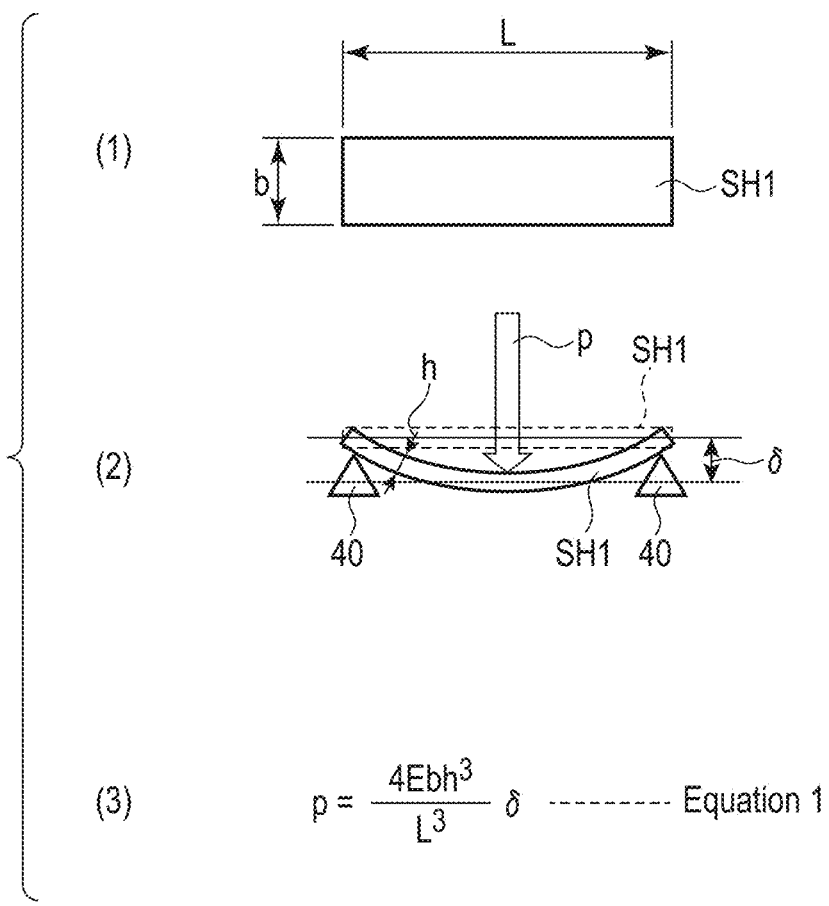
FIG. 22 is an illustration showing the relationship between a deflection and a load according to one first sheet member SH1.

FIG. 22 is an illustration showing the relationship between a deflection δ and a load p according to one first sheet member SH1.

An illustration in (1) of FIG. 22 is a plan view of the first sheet member SH1. The first sheet member SH1 has a rectangular shape having a width b and a length L.

An illustration in (2) of FIG. 22 is a cross-sectional view of the first sheet member SH1 and shows a state where the load p is put on the first sheet member SH1. The first sheet member SH1 has a thickness h. Both ends of the first sheet member SH1 are supported by support members 40. In addition, the load p is put at the center of the length L. The deflection δ is a difference between a state where the load p is not put on the first sheet member SH1 (a flat state of the first sheet member SH1 indicated by a broken line) and a state where the load p is put on the first sheet member SH1 (a warped state of the first sheet member SH1 indicated by a solid line) at the central position of the thickness h of the first sheet member SH1. Accordingly, the load p required for the first sheet member SH1 to have the deflection δ can be measured.

An illustration in (3) of FIG. 22 shows the relationship between the deflection δ and the load p. An equation representing the relationship between the deflection δ and the load p is expressed as the following equation 1 as shown in (3) of FIG. 22.

$$p = \{(4Ebh^3)/L^3\}\delta \qquad \text{(Equation 1)}$$

Here, E is the Young's modulus of the first sheet member SH1. As shown by the equation 1, the load p which provides the deflection δ is proportional to the cube of the thickness h and is inversely proportional to the cube of the length L.

FIG. 23 is an illustration showing the relationship between the deflection and the load according to two overlapping first sheet members SH1.

An illustration in (1) of FIG. 23 shows a completely integrated state of two first sheet members SH1. Here, the completely integrated state will be referred to as perfect coupling in the present specification. Two first sheet members SH1 are coupled by coupling members 50. In addition, two first sheet members SH1 are integrally warped. Since two first sheet members SH1 are completely integrated, these two first sheet members SH1 can be regarded as one second sheet member SH2 having a thickness twice as large as the thickness of the first sheet member SH1.

An illustration in (2) of FIG. 23 shows an equation representing the relationship between the deflection δ and a load PC of the second sheet member SH2 shown in (1) of FIG. 23. The first load required for the second sheet member SH2 having a thickness twice as large as the thickness of the first sheet member SH1 to have the deflection δ will be referred to as the load PC. The equation representing the relationship between the deflection δ and the load PC is expressed as the following equation 2 as shown in (2) of FIG. 23.

$$PC = 8(4Ebh^3/L^3)\delta \qquad \text{(Equation 2)}$$

In addition, since $(4Ebh^3/L^3)\delta = p$, the equation can be expressed as PC=8×p. It shows that the load required to have the same deflection δ as one first sheet member SH1 is eight times as high.

An illustration in (3) of FIG. 23 shows a completely unfastened state of two second sheet members SH1. Here, a completely unfastened state will be referred to as perfect decoupling in the present specification. An air layer AR is interposed between two first sheet members SH1. A multilayer stack of two first sheet members SH1 stacked via the air layer AR will be referred to as a first multilayer stack ST1. In addition, two first sheet members SH1 warp individually.

An illustration in (4) of FIG. 23 shows an equation representing the relationship between the deflection δ and a load PD of the first multilayer stack ST1 shown in (3) of FIG. 23. The second load required for the first multilayer stack ST1 to have the deflection δ will be referred to as the load PD. An equation representing the relationship between the deflection δ and the load PD is expressed as the following equation 3 as shown in (4) of FIG. 23.

$$PD = 2(4Ebh^3/L^3)\delta \quad \text{(Equation 3)}$$

In addition, since $(4Ebh^3/L^3)\delta=p$, the equation can be expressed as PD=2×p. It shows that the load required to have the same deflection δ as one first sheet member SH is twice as high.

Furthermore, when the equation 2 and the equation 3 are compared, PC is four times as high as PD. That is, it shows that, in a state where two first sheet members SH1 are perfectly coupled, the load required to have the same deflection δ is four times as high as the load required in a state where two first sheet members SH1 are perfectly decoupled.

An illustration in (5) of FIG. 23 shows a state where the decoupling layer DCP is interposed between two first sheet members SH1. A multilayer stack of two first sheet members SH1 stacked via the decoupling layer DCP will be referred to as a second multilayer stack ST2. By measuring the load P which provides the second multilayer stack ST2 with the same deflection δ as the second sheet member SH2 and the first multilayer stack ST1, the degree of coupling between two first sheet members SH1 can be calculated. That is, the decoupling performance of the decoupling layer DCP between two first sheet members SH1 can be quantitatively evaluated. In the present embodiment, a coupling coefficient is defined as an indicator of the decoupling performance of the decoupling layer DCP.

An illustration in (6) of FIG. 23 shows the coupling coefficient of the decoupling layer DCP. The third load required for the second multilayer stack ST2 to have the deflection δ will be referred to as a load P. A coupling coefficient C.C. of the decoupling layer DCP is expressed as the following equation 4 as shown in (6) of FIG. 23.

$$C.C. = (P - PD)/(PC - PD)$$

The coupling coefficient is 1 at the time of perfect coupling shown in (1) of FIG. 23 and is 0 at the time of perfect decoupling shown in (3) of FIG. 23.

FIG. 24 is an illustration showing the measurement evaluation of the coupling coefficient of the decoupling layer DCP.

The vertical axis of the graph shows the load (N). The horizontal axis of the graph shows one first sheet member SH1, the first multilayer stack ST1, the second multilayer stack ST2 and the second sheet member SH2 sequentially from the left. The first sheet member SH1 and the second sheet member SH2 here are, for example, plastic plates. The first sheet member SH1 has a length L=80 mm, a width b=20 mm and a thickness h=11 mm. Here, a load put on each of the first sheet member SH1, the first multilayer stack ST1, the second multilayer stack ST2 and the second sheet member SH2 to have a deflection δ=5 mm was measured. Note that the thickness of the decoupling layer DCP is 0.1 mm.

In the case of one first sheet member SH1, the load required to have the deflection of 5 mm was 1.7 N. In the case of the first multilayer stack ST1, the load required to have the deflection of 5 mm was 3.4 N. The load required for the first multilayer stack ST1 is twice as high as the load required for one first sheet member SH1. In the case of the second multilayer stack ST2, the load required to have the deflection of 5 mm was 5.2 N. In the case of the second sheet member SH2, the load required to have the deflection of 5 mm was 13.8 N. When the thickness of the first sheet member SH1 is h, the thickness of the second sheet member SH2 is 2 h. As shown in (2) of FIG. 23, when the thickness is twice as large, the load required is about eight times as high. Since the load required for the first sheet member SH1 is 1.7 N and the load required for the second sheet member SH2 is 13.8 N, it shows that the load becomes about right times as high.

According to the equation 4 in (6) of FIG. 23, the coupling coefficient of the decoupling layer DCP is calculated. Here, in the example shown in FIG. 24, since P=5.2, PC=13.8 and PD=3.4, and the coupling coefficient C.C. is expressed as follows.

$$C.C. = (5.2 - 3.4)/(13.8 - 3.4) = 0.17$$

The coupling coefficient of the decoupling layer DCP of 0.17 was obtained from the above results.

FIG. 25 shows the relationship between the coupling coefficient and the elastic modulus of the decoupling layer DCP. FIG. 25 shows the measurement results of the coupling coefficients of a plurality of decoupling layers.

The vertical axis of the graph shows the coupling coefficient, and the horizontal axis of the graph shows the elastic modulus (storage modulus). It shows that, from the perspective of the reliability and the operability of the flexible module, the coupling coefficient of the decoupling layer is preferably greater than or equal to 0 but less than or equal to 0.12. In many cases, when the decoupling layer has a coupling coefficient of less than or equal to 0.12, the decoupling layer has an elastic modulus of less than or equal to 100 KPa. That is, it is preferable to use a decoupling layer plotted in a range encompassed by a coupling coefficient of less than or equal to 0.12 and an elastic modulus of less than or equal to 100 KPa.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a first submodule including a substrate on which switching elements are formed;
   a second submodule including a cover member located on the substrate; and
   a first decoupling layer located between the first submodule and the second submodule, wherein
   each of the first submodule and the second submodule has a single neutral plane,
   when a first load required for a second sheet member having a thickness of two first sheet members to have a first deflection is PC,
   a second load required for a first multilayer stack of the two first sheet members stacked via an air layer to have the first deflection is PD, and a third load required for a second multilayer stack of the two first sheet members stacked via the first decoupling layer to have the first deflection is P, a coupling coefficient C.C. of the first decoupling layer is expressed as $$C.C. = (P - PD)/(PC - PD),$$

and the coupling coefficient is greater than or equal to 0 but less than or equal to 0.12.

2. The electronic device of claim 1, further comprising:
a third submodule located between the first submodule and the second submodule and having a single neutral plane; and
a second decoupling layer located between the second submodule and the third submodule, wherein
the first decoupling layer is located between the first submodule and the third submodule, and
the third submodule includes at least one of a touch panel and a polarizer.

3. The electronic device of claim 2, further comprising:
a fourth submodule located between the first submodule and the third submodule and having a single neutral plane; and
a third decoupling layer located between the third submodule and the fourth submodule, wherein
the first decoupling layer is located between the first submodule and the fourth submodule, and
the third submodule includes the polarizer, and the fourth submodule includes the touch panel.

4. The electronic device of claim 1, further comprising:
a fifth submodule located below the first submodule; and
a fourth decoupling layer located between the first submodule and the fifth submodule, wherein
the fifth submodule includes at least one of a heat dissipation sheet, a force feedback sheet, an illumination sheet, a buffer sheet, a sensor sheet and a housing.

5. The electronic device of claim 1, wherein the first decoupling layer contains at least one of a first material which is a non-linear elastic solid, and a second material which is a viscous fluid.

6. The electronic device of claim 5, wherein an elastic modulus of the first material is less than or equal to 100 KPa.

7. The electronic device of claim 1, wherein the first decoupling layer is transparent.

8. The electronic device of claim 1, further comprising a coupling portion located along a bend axis between the first submodule and the second submodule.

9. The electronic device of claim 1, further comprising:
a housing accommodating the first submodule and the second submodule; and
a fifth decoupling layer located between the first submodule and the second submodule and between the first submodule and the housing.

* * * * *